United States Patent
Johnson et al.

(10) Patent No.: US 9,837,123 B2
(45) Date of Patent: Dec. 5, 2017

(54) LAYERED AUDIO RECONSTRUCTION SYSTEM

(71) Applicant: DTS, Inc., Calabasas, CA (US)

(72) Inventors: Mark Rogers Johnson, Pasadena, CA (US); Phillip L. Maness, Thousand Oaks, CA (US)

(73) Assignee: DTS, Inc., Calabasas, CA (US)

(*) Notice: Subject to any disclaimer, the term of this patent is extended or adjusted under 35 U.S.C. 154(b) by 0 days.

(21) Appl. No.: 15/477,981

(22) Filed: Apr. 3, 2017

(65) Prior Publication Data
US 2017/0270968 A1    Sep. 21, 2017

Related U.S. Application Data

(63) Continuation of application No. 14/245,882, filed on Apr. 4, 2014, now Pat. No. 9,613,660.

(60) Provisional application No. 61/809,251, filed on Apr. 5, 2013.

(51) Int. Cl.
| | |
|---|---|
| *G10L 19/00* | (2013.01) |
| *G11B 27/031* | (2006.01) |
| *G11B 20/10* | (2006.01) |
| *G10L 19/24* | (2013.01) |
| *G10L 19/002* | (2013.01) |
| *H03M 7/30* | (2006.01) |

(52) U.S. Cl.
CPC .......... *G11B 27/031* (2013.01); *G10L 19/002* (2013.01); *G10L 19/24* (2013.01); *G11B 20/10527* (2013.01); *H03M 7/3084* (2013.01); *G11B 2020/10546* (2013.01)

(58) Field of Classification Search
USPC ................. 704/200–232, 500–504
See application file for complete search history.

(56) References Cited

U.S. PATENT DOCUMENTS

| | | |
|---|---|---|
| 4,332,979 A | 6/1982 | Fischer |
| 5,592,588 A | 1/1997 | Reekes et al. |
| 6,108,626 A | 8/2000 | Cellario et al. |
| 6,160,907 A | 12/2000 | Robotham et al. |
| 6,499,010 B1 | 12/2002 | Faller |
| 7,003,449 B1 | 2/2006 | Absar et al. |

(Continued)

FOREIGN PATENT DOCUMENTS

| | | |
|---|---|---|
| CN | 1330470 A | 1/2002 |
| EP | 2083584 | 7/2009 |

(Continued)

OTHER PUBLICATIONS

Advanced Multimedia Supplements API for Java 2 Micro Edition, May 17, 2005, JSR-234 Expert Group.

(Continued)

*Primary Examiner* — Jesse Pullias
(74) *Attorney, Agent, or Firm* — Knobbe Martens Olson & Bear LLP

(57) ABSTRACT

A computing device may receive or otherwise access a base audio layer and one or more enhancement audio layers. The computing device can reconstruct the retrieved base layer and/or enhancement layers into a single data stream or audio file. The local computing device may process audio frames in a highest enhancement layer retrieved in which the data can be validated (or a lower layer if the data in audio frames in the enhancement layer(s) cannot be validated) and build a stream or audio file based on the audio frames in that layer.

20 Claims, 17 Drawing Sheets

(56) References Cited

U.S. PATENT DOCUMENTS

| | | |
|---|---|---|
| 7,006,636 B2 | 2/2006 | Baumgarte et al. |
| 7,116,787 B2 | 10/2006 | Faller |
| 7,164,769 B2 | 1/2007 | Beard |
| 7,292,901 B2 | 11/2007 | Baumgarte et al. |
| 7,295,994 B2 | 11/2007 | Yoshida et al. |
| 7,394,903 B2 | 7/2008 | Herre et al. |
| 7,539,612 B2 | 5/2009 | Thumpudi et al. |
| 7,583,805 B2 | 9/2009 | Baumgarte et al. |
| 7,680,288 B2 | 3/2010 | Melchior et al. |
| 8,010,370 B2 | 8/2011 | Baumgarte |
| 8,321,230 B2 | 11/2012 | Philippe et al. |
| 2002/0007280 A1 | 1/2002 | McCree |
| 2002/0052738 A1 | 5/2002 | Paksoy et al. |
| 2002/0101369 A1 | 8/2002 | Gottesman |
| 2003/0219130 A1 | 11/2003 | Baumgarte et al. |
| 2005/0033661 A1 | 2/2005 | Yoshida et al. |
| 2005/0105442 A1 | 5/2005 | Melchior et al. |
| 2005/0147257 A1 | 7/2005 | Melchior et al. |
| 2006/0206221 A1 | 9/2006 | Metcalf |
| 2007/0088558 A1 | 4/2007 | Vos et al. |
| 2008/0005347 A1 | 1/2008 | Ott |
| 2008/0027709 A1 | 1/2008 | Baumgarte |
| 2008/0140426 A1 | 6/2008 | Kim et al. |
| 2008/0310640 A1 | 12/2008 | Oh et al. |
| 2009/0034613 A1 | 2/2009 | Youm |
| 2009/0060236 A1 | 3/2009 | Johnston et al. |
| 2009/0082888 A1 | 3/2009 | Johansen |
| 2009/0164222 A1 | 6/2009 | Kim et al. |
| 2009/0225993 A1 | 9/2009 | Cvetkovic |
| 2009/0237564 A1 | 9/2009 | Kikinis et al. |
| 2009/0326960 A1 | 12/2009 | Breebaart |
| 2010/0135510 A1 | 6/2010 | Yoo et al. |
| 2011/0013790 A1 | 1/2011 | Hilpert et al. |
| 2011/0040395 A1 | 2/2011 | Kraemer et al. |
| 2011/0187564 A1 | 8/2011 | Hu et al. |
| 2012/0057715 A1 | 3/2012 | Johnston et al. |
| 2012/0082319 A1 | 4/2012 | Jot et al. |
| 2012/0095760 A1 | 4/2012 | Ojala |
| 2013/0033642 A1 | 2/2013 | Wan et al. |

FOREIGN PATENT DOCUMENTS

| | | |
|---|---|---|
| JP | 2002-204437 | 7/2002 |
| JP | 2005-086537 | 3/2005 |
| JP | 2007-281640 | 10/2007 |
| WO | WO 2007/136187 | 11/2007 |
| WO | WO 2008/035275 | 3/2008 |
| WO | WO 2008/084436 | 7/2008 |
| WO | WO 2008/143561 | 11/2008 |
| WO | WO 2009/001277 | 12/2008 |
| WO | WO 2009/001292 | 12/2008 |

OTHER PUBLICATIONS

Adistambha et al., "An Investigation into Embedded Audio Coding Using an AAC Perceptually Lossless Base Layer", Proceedings of the 10th Australian International Conference on Speech Science & Technology Macquarie University, Sydney, Dec. 8-10, 2004.

AES Convention Paper Presented at the 107th Convention, Sep. 24-27, 1999 New York "Room Simulation for Multichannel Film and Music" Knud Bank Christensen and Thomas Lund.

AES Convention Paper Presented at the 124th Convention, May 17-20, 2008 Amsterdam, The Netherlands "Spatial Audio Object Coding (SAOC)" The Upcoming MPEG Standard on Parametric Object Based Audio Coding.

Ahmed et al. Adaptive Packet Video Streaming Over IP Networks: A Cross-Layer Approach [online]. IEEE Journal on Selected Areas in Communications, vol. 23, No. 2 Feb. 2005 [retrieved on Sep. 25, 2010]. Retrieved from the internet <URL: hllp://bcr2.uwaterloo.ca/~rboutaba/Papers/Joumals/JSA-5_2.pdf> entire document.

Amatriain et al, Audio Content Transmission [online]. Proceeding of the COST G-6 Conference on Digital Audio Effects (DAFX-01). 2001. [retrieved on Sep. 25, 2010]. Retrieved from the Internet <URI: http://www.csis.ul.ieldafx01lproceedingsipapers/am:atrlaln.pdf> pp. 1-6.

Engdegard et al., Spatial Audio Object Coding (SAOC)—The Upcoming MPEG Standard on Parametric Object Based Audio Coding, May 17-20, 2008.

Extended European Search Report issued in European Application No. 10808848.5 dated Oct. 9, 2015.

Gatzsche et al., Beyond DCI: The Integration of Object-Oriented 3D Sound Into the Digital Cinema, In Proc. 2008 NEM Summit, pp. 247-251. Saint-Malo, Oct. 15, 2008.

Goor et al. An Adaptive MPEG-4 Streaming System Based on Object Prioritisation [online]. ISSC. 2003. [retrieved on Sep. 25, 2010]. Retrieved from the Internet <URL: http://www.csis.ul.ie/dafx01/proceedings/papers/amatriain.pdf> pp. 1-5, entire document.

International Preliminary Report on Patentabiity issued in corresponding PCT Application No. PCT/US2012/28325 dated Feb. 15, 2013.

International Preliminary Report on Patentability issued in application No. PCT/US2010/045532 dated Feb. 14, 2012.

International Preliminary Report on Patentability issued in application No. PCT/US2010/045530 dated Sep. 28, 2011.

International Search Report and Written Opinion for PCT/US10/45532 dated Oct. 25, 2010. (SRSLABS.501VPC2).

International Search Report and Written Opinion for PCT/US10/45530 dated Sep. 30, 2010. (SRSLABS.501VPC1).

International Search Report and Written Opinion issued in application No. PCT/US2012/028325 dated Aug. 6, 2012.

International Search Report in corresponding PCT Application No. PCT/US2011/050885 dated Dec. 8, 2011.

International Search Report and Written Opinion PCT/2014/033049 dated Aug. 13, 2014 (11 pages).

ISO/IEC 23003-2:2010(E) International Standard—Information technology—MPEG audio technologies—Part 2: Spatial Audio Object Coding (SAOC), Oct. 1, 2010.

Jot, et al. Beyond Surround Sound—Creation, Coding and Reproduction of 3-D Audio Soundtracks. Audio Engineering Society Convention Paper 8463 presented at the 131st Convention Oct. 2-23, 2011.

MPEG-4 Overview—(Maui Version), ITU-T Draft, Study Period 1997-2000, International Telecommunication Union, Geneva, vol. Study Group 16, Dec. 1, 1999, p. 1-57.

MPEG-7 Overview, Standard [online]. International Organization for Standardization. 2004 [retrieved on Sep. 25, 2010). Retrieved from the Internet: <URL: http//mpeg.chiariglione.org/standards/mpeg-7/mpeg-7.htm> entire document.

Office Action issued in Chinese application No. 201080041989.0 dated Dec. 21, 2012.

Office Action issued in Chinese application No. 201080041993.7 dated Dec. 12, 2012.

Office Action issued in Chinese application No. 201080041993.7 dated Dec. 16, 2013.

Office Action issued in Chinese application No. 201080041993.7 dated Jun. 13, 2013.

Office Action issued in Japanese application No. 2012-5224921 dated May 20, 2014.

Office Action issued in Japanese application No. 2012-524919 dated Jun. 17, 2014.

Potard et al., Using XML Schemas to Create and Encode Interactive 3-D Audio Scenes for Multimedia and Virtual Reality Applications, 2002.

Pulkki, Ville. Virtual Sound Source Positioning Using Vector Base Amplitude Panning. Audio Engineering Society, Inc. 1997.

Salomon David, "Data Compression: the complete reference, Dictionary Methods", pp. 101-107, Jan. 1, 1998.

Sontacchi et al. Demonstrator for Controllable Focused Sound Source Reproduction. [online] 2008. [retrieved on Sep. 28, 2010). Retrieved from the internet: <URL: htlp://iem.at/projekte/publIcatIons/paper/demonstr/demonstrator.pdf> entire document.

| | SYNCWORD 411 | | HEADER 410 |
|---|---|---|---|
| CRC 412 | RESERVED 414 | COUNT 416 | |
| RESERVED 421 | SRC 422 | SIZE 424 | SRC OFFSET 426 | COMMAND 420A
| RESERVED 431 | SRC 432 | SIZE 434 | SRC OFFSET 436 | COMMAND 420B
| ⋮ | | | |
| RESERVED 441 | SRC 442 | SIZE 444 | SRC OFFSET 446 | COMMAND 420N
| DATA 450 | | | |

| | 711 | 712 | 713 | | |
|---|---|---|---|---|---|
| BASE 710 | 1001 1100 | 0011 0010 | 1011 0100 | | |

| | 721 | 722 | 723 | 724 | 725 |
|---|---|---|---|---|---|
| ENHANCE 720 | 1001 1100 | 0011 0010 | 1011 0100 | 0001 0000 | 0000 0110 |

| | 731 | 732 | 733 | 734 | 735 | 736 | 737 |
|---|---|---|---|---|---|---|---|
| ENHANCE 730 | 1001 1110 | 0011 0010 | 1011 0100 | 0001 0000 | 0000 0110 | 1111 1001 | 0011 0010 |

*FIG. 7A*

| | 711 | 712 | 713 | | |
|---|---|---|---|---|---|
| BASE 710 | 1001 1100 | 0011 0010 | 1011 0100 | | |

| | 721 | | | 724 | 725 |
|---|---|---|---|---|---|
| ENHANCE 720 | REF→711-713 | | | 0001 0000 | 0000 0110 |

| | 731 | 732 | 733 | 734 | 735 | 736 | 737 |
|---|---|---|---|---|---|---|---|
| ENHANCE 730 | 1001 1110 | 0011 0010 | 1011 0100 | 0001 0000 | 0000 0110 | 1111 1001 | 0011 0010 |

*FIG. 7B*

| | 711 | 712 | 713 | | |
|---|---|---|---|---|---|
| BASE 710 | 1001 1100 | 0011 0010 | 1011 0100 | | |

| | 721 | | | 724 | 725 |
|---|---|---|---|---|---|
| ENHANCE 720 | REF→711-713 | | | 0001 0000 | 0000 0110 |

| | 731 | 732 | 733 | 734 | 735 | 736 | 737 |
|---|---|---|---|---|---|---|---|
| ENHANCE 730 | REF→711-713 | | | REF→724-725 | | 1111 1001 | REF→712 |

*FIG. 7C*

LAYERED AUDIO RECONSTRUCTION SYSTEM

RELATED APPLICATIONS

This application is a continuation of U.S. patent application Ser. No. 14/245,882, entitled "LAYERED AUDIO RECONSTRUCTION SYSTEM" and filed on Apr. 4, 2014, which claims the benefit of priority under 35 U.S.C. §119(e) of U.S. Provisional Application No. 61/809,251, filed on Apr. 5, 2013, and entitled "LAYERED AUDIO CODING AND TRANSMISSION," the disclosures of which are hereby incorporated by reference herein in their entireties.

This application is related to U.S. patent application Ser. No. 14/245,903, entitled "LAYERED AUDIO CODING AND TRANSMISSION" and filed on Apr. 4, 2014, the entire contents of which is hereby incorporated by reference herein.

BACKGROUND

Conventionally, computing devices such as servers can store a large amount of audio data. Users can access such audio data if they have the appropriate permissions and a connection to the server, such as via a network. In some cases, a user that has permission and a connection to the server can download the audio data for storage on a local computing device. The user may initiate playback of the audio data downloaded to the local computing device once the download is complete. Alternatively, the user can stream the audio data such that the audio data is played on the local computing device in real-time (e.g., as the audio data is still in the process of being downloaded). In addition to streaming, the user can access the audio data for playback from packaged media (e.g., optical discs such as DVD or Blu-ray discs).

SUMMARY

Another aspect of the disclosure provides a method of reconstructing an audio stream. The method comprises accessing a server over a network to retrieve a first audio layer and a second audio layer. The method further comprises receiving the first audio layer and the second audio layer, each of the first and second audio layers comprising a plurality of audio frames. The first audio layer may comprise a base layer and the second audio layer comprises an enhancement to the base layer. The method further comprises identifying a reference in a first audio frame of the second audio layer. The reference may indicate a location in a second audio frame of the first audio layer, the reference being a substitute for audio data. The method further comprises substituting the reference in the first audio frame of the second audio layer with a first portion of audio data in the second audio frame of the first audio layer that corresponds with the location indicated by the reference. The method further comprises outputting the second audio layer to a decoder or loudspeaker, thereby enabling the enhancement to the base layer to be played back in place of the base layer.

The method of the preceding paragraph can have any sub-combination of the following features: where the method further comprises extracting a hash value from the first audio frame prior to identifying the reference, and comparing the hash value with a second portion in the first audio frame and a third portion in the second audio frame; where the method further comprises outputting the first audio layer if the second portion in the first audio frame and the third portion in the second audio frame do not match the hash value; where the first audio frame comprises the reference and data that does not refer to another audio frame; and where the method further comprises generating a third audio frame based on the first portion in the second audio frame and the data in the first audio frame that does not refer to another audio frame.

Another aspect of the disclosure provides a system for reconstructing an audio stream. The system comprises a layer constructor comprising a hardware processor configured to access a first audio layer and a second audio layer. The hardware processor may be further configured to identify a reference in a first audio frame of the second audio layer. The reference may indicate a location in a second audio frame of the first audio layer. The hardware processor may be further configured to substitute the reference in the first audio frame with a first portion in the second audio frame that corresponds with the location indicated by the reference. The hardware processor may be further configured to output the second audio layer.

The system of the preceding paragraph can have any sub-combination of the following features: where the layer constructor is further configured to extract a hash value from the first audio frame prior to identifying the reference, and compare the hash value with a second portion in the first audio frame and a third portion in the second audio frame; where the layer constructor is further configured to output the first audio layer if the second portion in the first audio frame and the third portion in the second audio frame do not match the hash value; where the system further comprises a network communication device configured to access a server over a network to retrieve the first audio layer and the second audio layer, where the processor is further configured to access the first audio layer and the second audio layer from the network communication device; where the system further comprises a computer-readable storage medium reader configured to read a computer-readable storage medium, where the computer-readable storage medium comprises the first audio layer and the second audio layer; where the processor is further configured to access the first audio layer and the second audio layer from the computer-readable storage medium via the computer-readable storage medium reader; where the first audio frame comprises the reference and data that does not refer to another audio frame; where the layer constructor is further configured to generate a third audio frame based on the first portion in the second audio frame and the data in the first audio frame that does not refer to another audio frame; where the layer constructor is further configured to generate the third audio frame in an order in which the reference and the data in the first audio frame that does not refer to another audio frame appear in the first audio frame; and where the system further comprises a decoder configured to decode the third audio frame, where the decoder is further configured to output the decoded third audio frame to the speaker.

Another aspect of the disclosure provides non-transitory physical computer storage comprising executable program instructions stored thereon that, when executed by a hardware processor, are configured to at least access a first audio layer and a second audio layer. The executable program instructions are further configured to at least identify a reference in a first audio frame of the second audio layer. The reference indicates a location in a second audio frame of the first audio layer. The executable program instructions are further configured to at least substitute the reference in the first audio frame with a first portion in the second audio frame that corresponds with the location indicated by the reference. The executable program instructions are further configured to at least output the second audio layer.

The non-transitory physical computer storage of the preceding paragraph can have any sub-combination of the following features: where the executable instructions are further configured to at least extract a hash value from the first audio frame prior to the identification of the reference, and compare the hash value with a second portion in the first audio frame and a third portion in the second audio frame; where the executable instructions are further configured to at least output the first audio layer if the second portion in the first audio frame and the third portion in the second audio frame do not match the hash value; where the executable instructions are further configured to at least access a server over a network to retrieve the first audio layer and the second audio layer; and where the executable instructions are further configured to at least read a computer-readable storage medium, and where the computer-readable storage medium comprises the first audio layer and the second audio layer.

For purposes of summarizing the disclosure, certain aspects, advantages and novel features of the inventions have been described herein. It is to be understood that not necessarily all such advantages can be achieved in accordance with any particular embodiment of the inventions disclosed herein. Thus, the inventions disclosed herein can be embodied or carried out in a manner that achieves or optimizes one advantage or group of advantages as taught herein without necessarily achieving other advantages as can be taught or suggested herein.

BRIEF DESCRIPTION OF THE DRAWINGS

Throughout the drawings, reference numbers are re-used to indicate correspondence between referenced elements. The drawings are provided to illustrate embodiments of the inventions described herein and not to limit the scope thereof.

FIG. 4 illustrates an example enhancement layer audio block.

FIGS. 7A-C illustrate example features for substituting common data with commands

DETAILED DESCRIPTION

Introduction

Figure 1:
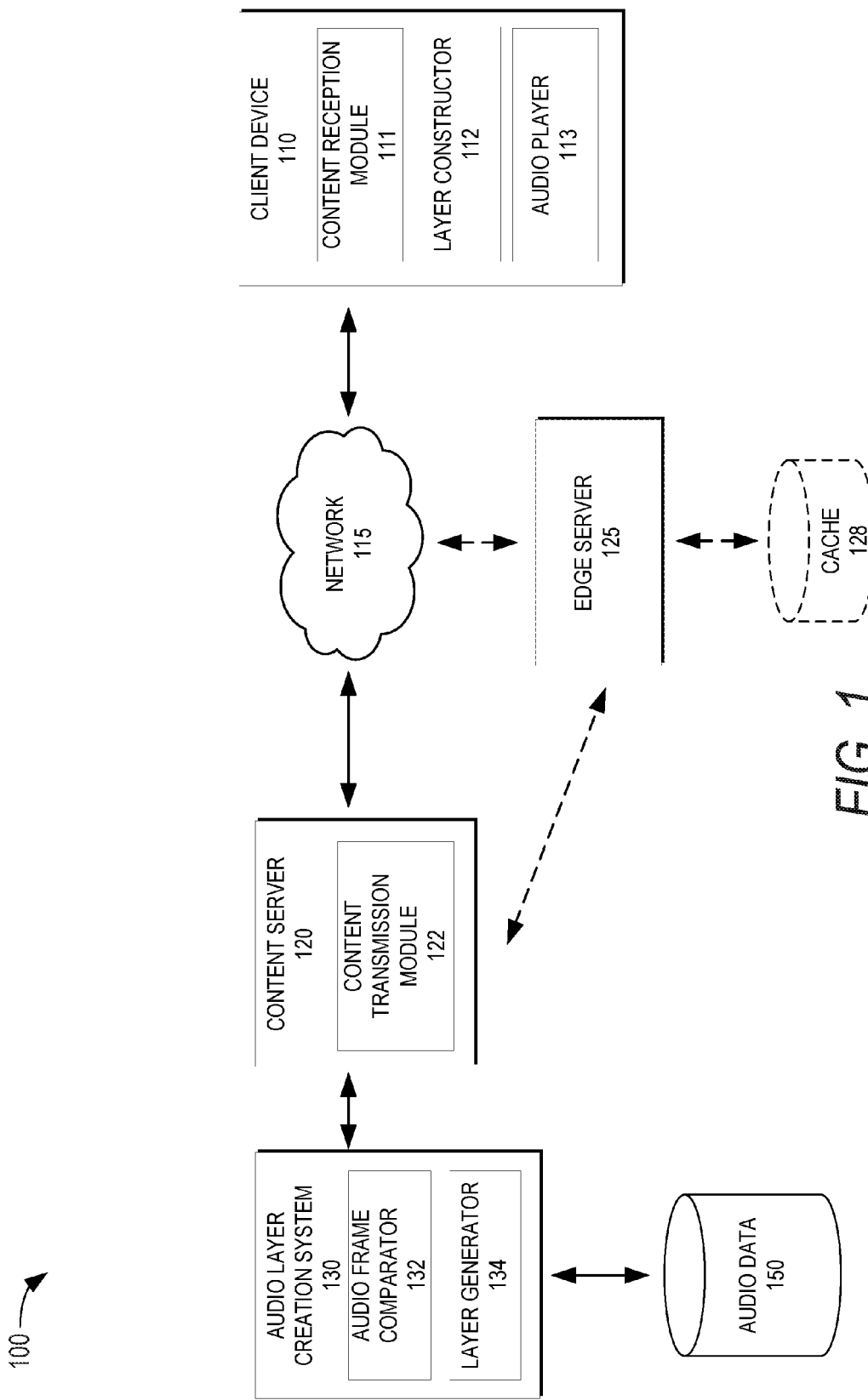
FIG. 1 illustrates an embodiment of an audio layering environment.

As described above, a user may desire to download or stream content from a server. However, the local computing device operated by the user may have issues connecting with the server or reduced bandwidth, which may degrade the quality of the data stream and/or prevent the data from being streamed. In some instances, the system may be configured to detect the available bandwidth and adjust the stream accordingly. For example, the system could organize frames of an audio file (the frames each including a plurality of audio samples) such that each frame includes more significant data first and less significant data last. Thus, if the available bandwidth is not enough to transmit the entirety of each audio frame, the system could eliminate the portions of each audio frame that include the less significant data (e.g., thereby lowering the bitrate) such that the audio frames can be transmitted successfully.

However, often streaming applications supported by servers do not play an active role in the transmission of data. Rather, the streaming applications support protocols that allow other computing devices to access the streamed data using a network. The streaming applications may not perform any processing of the data other than reading and transmitting.

In fact, some servers may be part of a content delivery network that includes other servers, data repositories, and/or the like. The content that is ultimately streamed from an initial server (e.g., an origin server) may be stored on devices other than the server that connects with the local computing device (e.g., an edge server). The edge server may support a caching infrastructure such that when a first local computing device requests data, the data may be stored in cache. When a second local computing device requests the same data, the data may be retrieved from cache rather than from other devices in the content delivery network. However, if the origin server were to process data based on available bandwidth, it may cause caches on edge servers to be invalid. While the requests from the first local computing device and the second local computing device may be the same, the data that is transmitted to the first local computing device may not be appropriate for the second local computing device, and therefore cannot be reasonably cached.

Further, the tremendous increase in the volume of multimedia streams, and the enterprise value in delivering these streams at higher quality levels is placing an ever increasing burden on storage in various tiers of the network, and the volume of data transferred throughout the network. As a result of these stresses on the system, audio quality is often compromised when compared to the multimedia experience delivered on non-streamed delivery mechanisms, such as optical discs, and files that are delivered and stored for playback on the consumer owned appliances.

Accordingly, embodiments of an audio layering system are described herein that can allow local computing devices to request (or a server to provide) a variable amount of data based on network resources (e.g., available bandwidth, latency, etc.). An audio stream may include a plurality of audio frames. The audio layering system may separate each audio frame into one or more layers. For example, an audio frame may be separated into a base layer and one or more enhancement layers. The base layer may include a core amount of data (e.g., a normal and fully playable audio track). A first enhancement layer, if present, may include an incremental amount of data that enhances the core amount of data (e.g., by adding resolution detail, adding channels, adding higher audio sampling frequencies, combinations of the same, or the like). The first enhancement layer may be dependent on the base layer. A second enhancement layer, if present, may include an incremental amount of data that enhances the combined data in the first enhancement layer and/or the base layer and may be dependent on the first enhancement layer and the base layer. Additional enhancement layers may be similarly provided in some embodiments. The one or more enhancement layers, when combined with the base layer, can transform the base layer from a basic or partial audio track into a richer, more detailed audio track.

The enhancement layers may contain the instructions and data to assemble a higher performance audio track. For example, an enhancement layer may add an additional audio channel. The base layer may include 5.1 channels in a surround-sound format (e.g., including left front, right front, center, left and rear surround, and subwoofer channels). The enhancement layer may include data that, when combined with the base layer, makes an audio stream with 6.1 channels. As another example, an enhancement layer may increase the sampling frequency. Thus, the base layer may be a 48 kHz stream, a first enhancement layer may include data to result in a 96 kHz stream, and a second enhancement layer may include data to result in a 192 kHz stream, or the like. As another example, an enhancement layer may add resolution detail (e.g., the base layer may be a 16-bit stream and the enhancement layer may include data to result in a 24-bit stream). As another example, an enhancement layer may add an optional or alternative audio stream in which the volume may be independently controlled (e.g., a base layer may include the sounds on the field in a sports match, a first enhancement layer may include a home team announcer audio stream, a first alternate enhancement layer may include an away team announcer audio stream, a second enhancement layer may include an English language announcer audio stream, a second alternate enhancement layer may include a Spanish language announcer audio stream, and so forth).

The base layer and the enhancement layers may be available on a server in the audio layering system. A local computing device may access the server to download or stream the base layer and/or the enhancement layers. The local computing device may retrieve the base layer and some or all of the enhancement layers if the local computing device has a sufficient amount of bandwidth available such that playback of the content may be uninterrupted as the base layer and all of the enhancement layers are retrieved. Likewise, the local computing device may retrieve the base layer and only the first enhancement layer if the available bandwidth dictates that playback of the content may be uninterrupted if no data in addition to the base layer and the first enhancement layer is retrieved. Similarly, the local computing device may retrieve just the base layer if the available bandwidth dictates that playback of the content will be uninterrupted if no data in addition to the base layer is retrieved.

In some embodiments, the local computing device (or the server) adjusts, in real-time or near real-time, the amount of data that is retrieved by the local computing device (or transmitted by the server) based on fluctuations in the available bandwidth. For example, the local computing device may retrieve the base layer and some or all of the enhancement layers when a large amount of bandwidth is available to the local computing device. If the amount of bandwidth drops, the local computing device may adjust such that the base layer and just the first enhancement layer are retrieved. Later, if the amount of bandwidth increases, then the local computing device may again retrieve the base layer and all of the enhancement layers. Thus, the audio layering system may support continuous, uninterrupted playback of content even as fluctuations in a network environment occur.

In an embodiment, the audio layering system generates the base layer and the enhancement layers based on a comparison of individual audio frames. The audio layering system may first compare a first audio frame to a second audio frame. The first audio frame and the second audio frame may be audio frames that correspond to the same period of time in separate streams (e.g., a low bitrate stream and a high bitrate stream). Based on the differences in the frames (e.g., the size of the frame), the audio layers system may identify one audio frame as an audio frame in the base layer (e.g., the smaller audio frame) and the other audio frame as an audio frame in a first enhancement layer (e.g., the larger audio frame). The audio layering system may then compare the two audio frames to identify similarities. For example, the base layer audio frame and the first enhancement layer audio frame may share a sequence of bits or bytes. If this is the case, the sequence in the first enhancement layer audio frame may be substituted or replaced with a reference to the base layer audio frame and a location in the base layer audio frame in which the common sequence is found. The base layer audio frame and the first enhancement layer audio frame may share multiple contiguous and non-contiguous sequences, and each common sequence in the first enhancement layer audio frame may be substituted or replaced with an appropriate reference. For simplicity, the remaining portion of the disclosure uses the term "substitute." However, substituting could be understood to mean replacing in some embodiments Likewise, a third audio frame corresponding to a second enhancement layer may be compared with the base layer audio frame and the first enhancement layer audio frame. Sequences in the second enhancement layer audio frame that are similar to or the same as those in the base layer audio frame may be substituted with references as described above. Sequences in the second enhancement layer audio frame that are similar to or the same as those in the first enhancement layer audio frame may be substituted with references to the first enhancement layer audio frame. The process described herein may be completed for audio frames in each additional enhancement layer.

The audio layering system may also generate a hash (e.g., a checksum, a cyclic redundancy check (CRC), MD5, SHA-1, etc.) that is inserted into an enhancement layer audio frame. The hash may be generated using any publicly-available or proprietary hash calculation algorithm, for example, based on bits or bytes in the data portion of the enhancement layer audio frame and bits or bytes in the data portion of the parent audio frame (e.g., the parent of a first enhancement layer is the base layer, the parent of a second enhancement layer is the first enhancement layer, etc.). For example, the hash may be generated based on some defined portion of data of the parent audio frame (e.g., a first portion and a last portion of the parent audio frame) and some defined portion of data of the enhancement layer audio frame (e.g., a first portion and a last portion of the enhancement layer audio frame). The hash may be used to validate the retrieved content, as will be described in greater detail below.

In an embodiment, once the local computing device retrieves the base layer and one or more enhancement layers, the hash is checked to ensure or attempt to ensure the validity of the data. The hash in the target audio frame may be compared with bits or bytes in the target audio frame and bits or bytes in a parent layer audio frame. If the hash correlates to the compared bits or bytes (e.g., matches), then the local computing device may reconstruct a data stream based on the target audio frame. If the hash does not correlate to the compared bits or bytes, then the local computing device may not reconstruct a data stream based on the target audio frame. Instead, the local computing device may reconstruct a data stream based on an audio frame in the next highest enhancement layer (or the base layer audio frame) if the hash can be validated. If the hash again cannot be validated, the local computing device may continue the same process with the next lowest enhancement layer audio frame until a hash can be validated (if at all). Thus, in an embodiment, the local computing device may be able to provide continuous, uninterrupted playback of the content even if the data in one or more enhancement layer audio frames is corrupted.

The local computing device may reconstruct the retrieved base layer and/or enhancement layers into a single data stream or audio file based on the inserted references. The local computing device may process audio frames in the highest enhancement layer retrieved (e.g., the enhancement layer that has no child layer may be considered the highest enhancement layer, and the enhancement layer that has the base layer as a parent may be considered the lowest enhancement layer) in which the data can be validated (or the base layer if the data in audio frames in the enhancement layers cannot be validated) and build a stream or audio file based on the audio frames in that layer. For example, the local computing device may create a target audio frame (e.g., stored in a buffer or sent directly to a decoder) based on a highest enhancement layer audio frame. The highest enhancement layer audio frame may include one or more references and a data portion. A reference may function as a command such that when a reference is identified, the local computing device may execute the reference to retrieve the referenced content in a current audio frame or a parent audio frame. The local computing device may execute the one or more references and store the retrieved content in a buffer that stores the target audio frame (or the local computing device may send the referenced bits directly to the decoder). The local computing device may execute the references in order from the header of the audio frame to the end of the data portion of the audio frame. This process may continue until the highest enhancement layer audio frame has been fully processed. Lower enhancement layer audio frames may not be analyzed in this manner unless a hash check fails, as described below.

Overview of Example Audio Layering System

By way of overview, FIG. 1 illustrates an embodiment of an audio layering environment 100. The audio layering environment 100 can enable streaming of layered audio data to end users. The devices operated by the end users can reconstruct the layered audio data stream into a single audio data stream that can be played uninterrupted even if there are fluctuations in the network environment.

The various components of the object-based audio environment 100 shown can be implemented in computer hardware and/or software. In the depicted embodiment, the audio layering environment 100 includes a client device 110, a content transmission module 122 implemented in a content server 120 (for illustration purposes), and an audio layer creation system 130. The audio layering environment 100 may optionally include an edge server 125 and a cache 128. By way of overview, the audio layer creation system 130 can provide functionality for content creator users (not shown) to create layered audio data. The content transmission module 122, shown optionally installed on a content server 120, can be used to stream layered audio data to the client device 110 over a network 115 and/or to the edge server 125. The network 115 can include a local area network (LAN), a wide area network (WAN), the Internet, or combinations of the same. The edge server 125 can also be used to stream layered audio data to the client device 110 over the network 115. The edge server 125 may store layered audio data in the cache 128 when the data is first requested such that the data can be retrieved from the cache 128 rather than the content server 120 when the same data is requested again. The client device 110 can be an end-user system that reconstructs a layered audio data stream into a single audio data stream and renders the audio data stream for output to one or more loudspeakers (not shown). For instance, the client device 110 can be any form of electronic audio device or computing device. For example, the client device 110 can be a desktop computer, laptop, tablet, personal digital assistant (PDA), television, wireless handheld device (such as a smartphone), sound bar, set-top box, audio/visual (AV) receiver, home theater system component, combinations of the same, and/or the like. While one client device 110 is depicted in FIG. 1, this is not meant to be limiting. The audio layering environment 100 may include any number of client devices 110.

In the depicted embodiment, the audio layer creation system 130 includes an audio frame comparator 132 and a layer generator 134. The audio frame comparator 132 and the layer generator 134 can provide tools for generating layered audio data based on one or more audio streams. The audio stream can be stored in and retrieved from an audio data repository 150, which can include a database, file system, or other data storage. Any type of audio can be used to generate the layered audio data, including, for example, audio associated with movies, television, movie trailers, music, music videos, other online videos, video games, advertisements, and the like. In some embodiments, before the audio stream is manipulated by the audio frame comparator 132 and the layer generator 134, the audio stream is encoded (e.g., by an encoder in the audio layer creation system 130) as uncompressed LPCM (linear pulse code modulation) audio together with associated attribute metadata. In other embodiments, before the audio stream is manipulated by the audio frame comparator 132 and the layer generator 134, compression is also applied to the audio stream (e.g., by the encoder in the audio layer creation system 130, not shown). The compression may take the form of lossless or lossy audio bitrate reduction to attempt to provide substantially the same audible pre-compression result with reduced bitrate.

The audio frame comparator 132 can provide a user interface that enables a content creator user to access, edit, or otherwise manipulate one or more audio files to convert the one or more audio files into one or more layered audio files. The audio frame comparator 132 can also generate one or more layered audio files programmatically from one or more audio files, without interaction from a user. Each audio file may be composed of audio frames, which can each include a plurality of audio blocks. The audio frame comparator 132 may modify enhancement layer audio frames to include commands to facilitate later combination of layers into a single audio stream, as will be described in greater detail below (see, e.g., FIG. 3).

The layer generator 134 can compile the audio frames that correspond to a particular layer to generate an audio base layer and one or more audio enhancement layers that are suitable for transmission over a network. The layer generator 134 can store the generated layered audio data in the audio data repository 150 or immediately transmit the generated layered audio data to the content server 120.

The audio layer creation system 130 can supply the generated layered audio files to the content server 120 over a network (not shown). The content server 120 can host the generated layered audio files for later transmission. The content server 120 can include one or more machines, such as physical computing devices. The content server 120 can be accessible to the client device 110 over the network 115. For instance, the content server 120 can be a web server, an application server, a cloud computing resource (such as a physical or virtual server), or the like. The content server 120 may be implemented as a plurality of computing devices each including a copy of the layered audio files, which devices may be geographically distributed or co-located.

The content server 120 can also provide generated layered audio files to the edge server 125. The edge server 125 can transmit the generated layered audio files to the client device 110 over the network 115 and/or can store the generated layered audio files in the cache 128, which can include a database, file system, or other data storage, for later transmission. The edge server 125 can be a web server, an application server, a cloud computing resource (such as a physical or virtual server), or the like. The edge server 125 may be implemented as a plurality of computing devices each including a copy of the layered audio files, which devices may be geographically distributed or co-located.

The client device 110 can access the content server 120 to request audio content. In response to receiving such a request, the content server 120 can stream, download, or otherwise transmit one or more layered audio files to the client device 110. The content server 120 may provide each layered audio file to the client device 110 using a suitable application layer protocol, such as the hypertext transfer protocol (HTTP). The content server 120 may also provide the layered audio files to the client device 110 may use any suitable transport protocol to transmit the layer audio files, such as the Transmission Control Protocol (TCP) or User Datagram Protocol (UDP).

In the depicted embodiment, the client device 110 includes a content reception module 111, a layer constructor 112, and an audio player 113. The content reception module 111 can receive the generated layered audio files from the content server 120 and/or the edge server 125 over the network 115. The layer constructor 112 can compile the generated layered audio files into an audio stream. For example, the layer constructor 112 can execute commands found in the layered audio file(s) to construct a single audio stream from the streamed layered audio file(s), as will be described in greater detail below. The audio player 113 can decode and play back the audio stream.

The client device 110 can monitor available network 115 resources, such as network bandwidth, latency, and so forth. Based on the available network 115 resources, the client device 110 can determine which audio layers, if any, to request for streaming or download from the content transmission module 122 in the content server 120. For instance, as network resources become more available, the client device 110 may request additional enhancement layers. Likewise, as network resources become less available, the client device 110 may request fewer enhancement layers. This monitoring activity, in an embodiment, can free the content server 120 from monitoring available network 115 resources. As a result, the content server 120 may act as a passive network storage device. In other embodiments, however, the content server 120 monitors available network bandwidth and adapts transmission of layered audio files accordingly. In still other embodiments, neither the client device 110 nor content server 120 monitor network bandwidth. Instead, the content server 120 provides the client device 110 with options to download or stream different bitrate versions of an audio file, and the user of the client device 110 can select an appropriate version for streaming. Selecting a higher bitrate version of an audio file may result in the content server 120 streaming or downloading more enhancement layers to the client device 110.

Although not shown, the audio frame comparator 132 and/or the layer generator 134 can be moved from the audio layer creation system 130 to the content server 120. In such an embodiment, the audio layer creation system 130 can upload an audio stream or individual audio frames to the content server 120. Generation of the layered audio data can therefore be performed on the content server 120 in some embodiments. In addition or alternatively, the layer constructor 112 can be moved from the client device 110 to the content server 120. Responding in real-time to requests from the client device 110, the content server 120 can apply layer construction and transmit whole, decodable audio frames to the client device 110. This may be beneficial for storing the layered content efficiently while still being able to transmit over legacy streaming or downloading protocols that may not otherwise support multi-layer dependencies.

For ease of illustration, this specification primarily describes audio layering techniques in the context of streaming or downloading audio over a network. However, audio layering techniques can also be implemented in non-network environments. For instance, layered audio data can be stored on a computer-readable storage medium, such as a DVD disc, Blu-ray disc, a hard disk drive, or the like. A media player (such as a Blu-ray player) can reconstruct the stored layered audio data into a single audio stream, decode the audio stream, and play back the decoded audio stream. In some embodiments, one or more of the stored audio layers is encrypted. For example, an enhancement layer may include premium content or additional features (e.g., director's commentary, lossless audio, etc.). The enhancement layer may be encrypted and unlocked (and thus can be included in the audio stream) if payment is provided, a code is entered, and/or the like.

Further, the functionality of certain components described with respect to FIG. 1 can be combined, modified, or omitted. For example, in one implementation, the audio layer creation system 130 can be implemented on the content server 120. Audio streams could be streamed directly from the audio layer creation system 130 to the client device 110. Many other configurations are possible.

Example Audio Layers and Work Flow

Figure 2A:
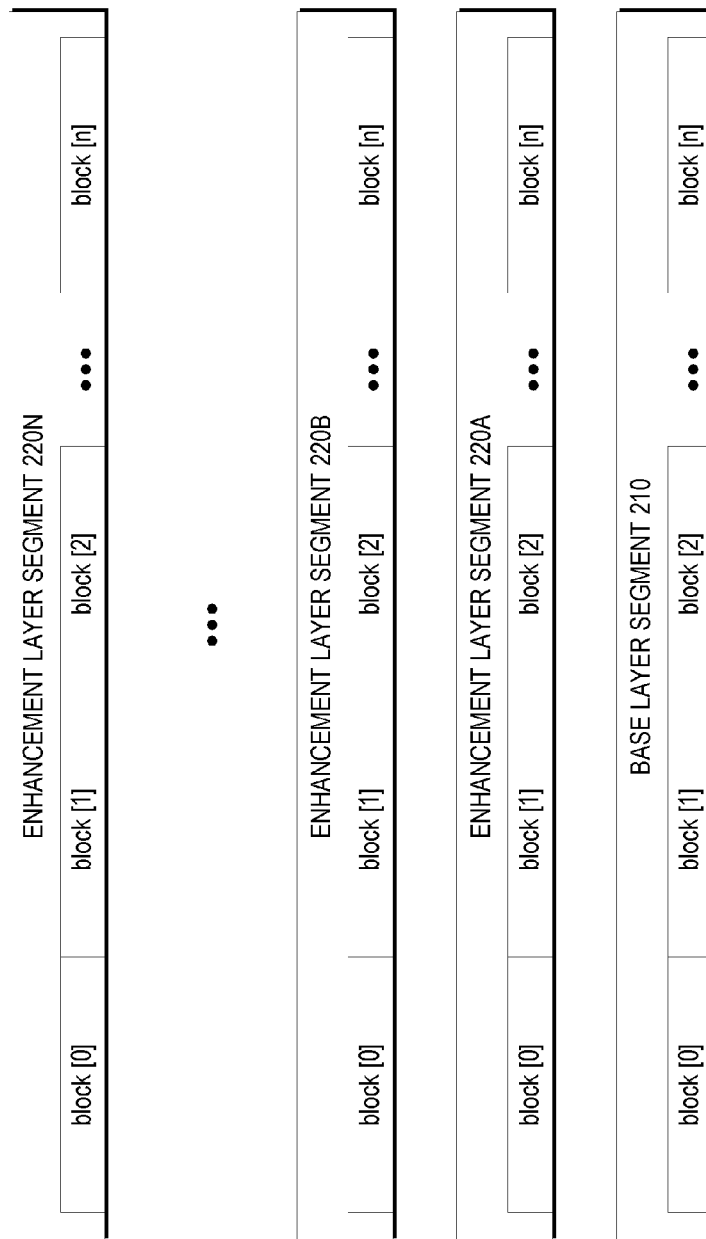
FIG. 2A illustrates an example block diagram of base layer and enhancement layer segments.

FIG. 2A illustrates an example block diagram of base layer and enhancement layer segments. As illustrated in FIG. 2A, a base layer segment 210 and enhancement layer segments 220A-N may each include n audio blocks, where n is an integer. In an embodiment, an audio block can be an audio sample or audio frame as defined by ISO/IEC 14496 part 12. Each block can include a plurality of audio frames as well as header information. An example block is described in greater detail with respect to FIG. 4 below.

With continued reference to FIG. 2A, block 0 in the base layer segment 210 may correspond with blocks 0 in the enhancement layer segments 220A-N, and the other blocks may each correspond with each other in a similar manner. The block boundaries in the base layer segment 210 and the enhancement layer segments 220A-N may be aligned. For instance, the base layer segment 210 and the enhancement layer segments 220A-N may be processed according to the same clock signal at the client device.

In an embodiment, block 0 in the base layer segment 210 includes data that can be used to play a basic audio track. Block 0 in the enhancement layer segment 220A may include data that, when combined with block 0 in the base layer segment 210, constitutes an audio track that has higher performance than the basic audio track. Similarly, block 0 in the enhancement layer segment 220B may include data that, when combined with block 0 in the base layer segment 210 and with block 0 in the enhancement layer segment 220A, constitutes an audio track that has higher performance than the basic audio track and the audio track based on the base layer segment 210 and the enhancement layer segment 220A.

Figure 2B:
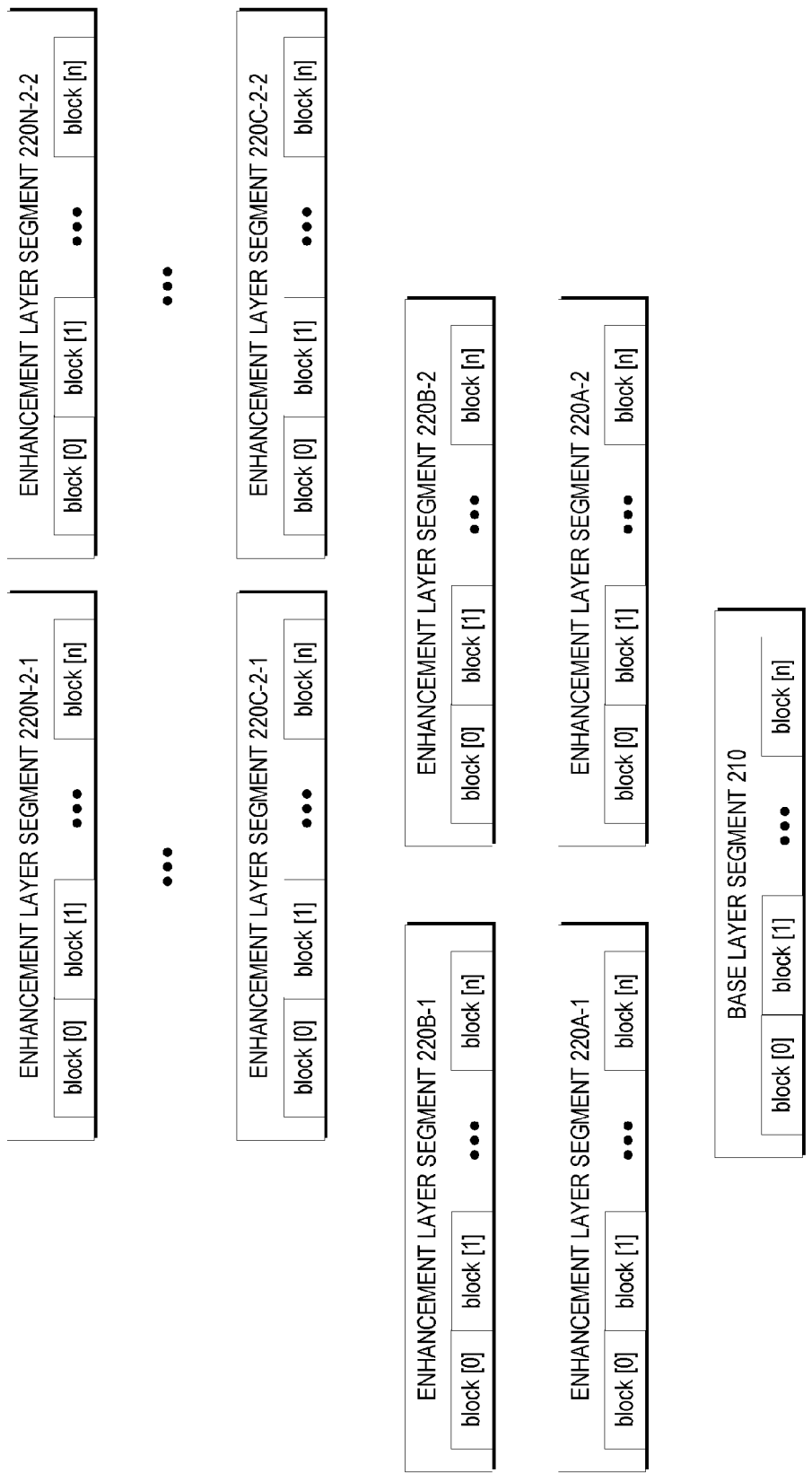
FIG. 2B illustrates an example block diagram of base layer and alternate enhancement layer segments.

FIG. 2B illustrates an example block diagram of base layer and alternate enhancement layer segments. As illustrated in FIG. 2B, the base layer segment 210 and enhancement layer segments 220A-1, 220B-1, 220A-2, 220B-2, 220C-2-1 through 220N-2-1, and 220C-2-2 through 220N-2-2 may each include n audio blocks, where n is an integer. The blocks may be similar to the blocks described above with respect to FIG. 2A.

With continued reference to FIG. 2B, enhancement layer segments 220A-1 and 220A-2 may be alternative enhancement layer segments. For example, the enhancement layer segment 220A-1 may include blocks that enhance the content of the blocks in the base layer segment 210. Likewise, the enhancement layer segment 220A-2 may include blocks that enhance the content of the blocks in the base layer segment 210. However, both the enhancement layer segment 220A-1 and the enhancement layer segment 220A-2 may not be used to enhance the content of the blocks in the base layer segment 210. As an example, the base layer segment 210 could include audio associated with the sounds on the field of a sports match. The enhancement layer segment 220A-1 may include audio associated with a home team announcer and the enhancement layer segment 220A-2 may include audio associated with an away team announcer.

The enhancement layer segment 220B-1 may include audio that enhances the audio of the enhancement layer segment 220A-1. Likewise, the enhancement layer segment 220B-2 may include audio that enhances the audio of the enhancement layer segment 220A-2. The enhancement layer segment 220B-1 may not be used if the enhancement layer segment 220A-2 is chosen. Similarly, the enhancement layer segment 220B-2 may not be used if the enhancement layer segment 220A-1 is chosen.

Any enhancement layer segment may be further associated with alternative enhancement layer segments. For example, the enhancement layer segment 220B-2 may be associated with the enhancement layer segment 220C-2-1 and an alternate enhancement layer segment, the enhancement layer segment 220C-2-2.

Figure 3:
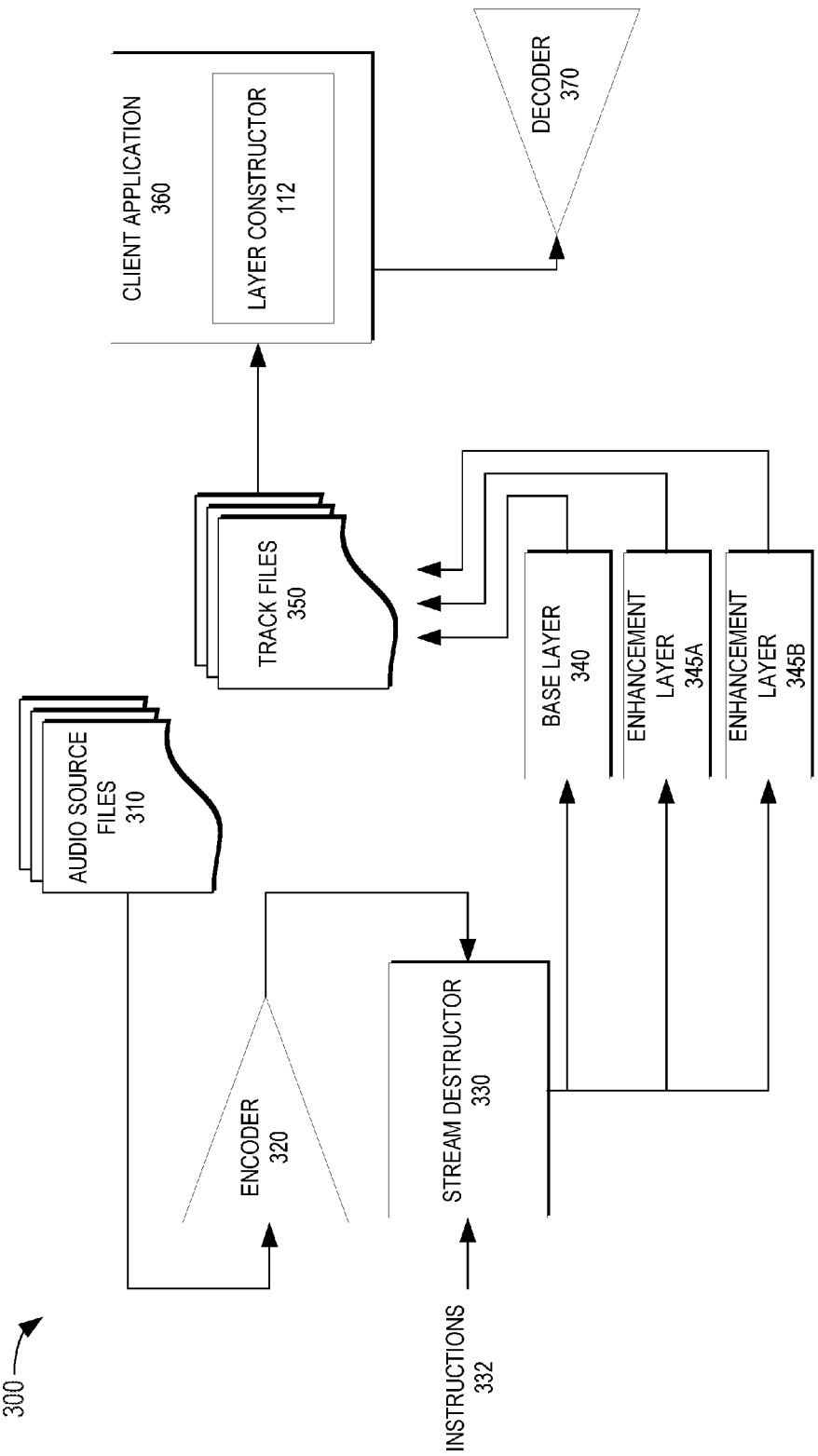
FIG. 3 illustrates an example block diagram of a work flow of the audio layering environment of FIG. 1.

FIG. 3 illustrates a block diagram of an example work flow 300 of the audio layering environment 100 of FIG. 1. As illustrated in FIG. 3, one or more audio source files 310 may be sent to an encoder 320. The encoder 320 may be similar to a scalable encoder described in U.S. Pat. No. 7,333,929 to Beaton et al., titled "Modular Scalable Compressed Audio Data Stream," which is hereby incorporated herein by reference in its entirety. While FIG. 3 illustrates a single encoder 320, this is not meant to be limiting. The example work flow 300 may include a plurality of encoders 320. For example, if the one or more audio source files 310 include multiple enhancement layers (either dependent layers or alternate layers), each encoder 320 may be assigned to a different layer to maintain time alignment between the base layer and the multiple enhancement layers. However, a single encoder 320 that handles all of the layers may also be able to maintain the time alignment.

In an embodiment, a stream destructor 330 receives the one or more encoded audio source files 310 from the one or more encoders 320 and generates a base layer 340, an enhancement layer 345A, and an enhancement layer 345B. Two enhancement layers are shown for illustration purposes, although more or fewer may be generated in other embodiments. The encoder 320 and/or the stream destructor 330 may represent the functionality provided by the audio layer creation system 130 of FIG. 1 (e.g., the audio frame comparator 132 and the layer generator 134). The stream destructor 330 may generate the layers based on the encoded audio source files 310 and/or authoring instructions (e.g., instructions identifying what enhancement is carried in each enhancement layer, such as target stream bitrates, a number of channels, the types of alternate layers, etc.) 332 received from a content creator user.

The stream destructor 330 (e.g., the audio frame comparator 132 and the layer generator 134) may generate the base layer 340 and the enhancement layers 345A-B based on a comparison of individual audio frames from the encoded audio source files 310. The stream destructor 330 may first compare a first audio frame to a second audio frame, where the two audio frames correspond to the same timeframe. Based on the differences in the frames (e.g., differences can include the size of the frames, the number of channels present in the frame, etc.), the stream destructor 330 may identify one audio frame as an audio frame in the base layer 340 and the other audio frame as an audio frame in the enhancement layer 345A. For example, because enhancement layer audio frames enhance base layer audio frames, the stream destructor 330 may identify the larger audio frame as the audio frame in the enhancement layer 345A.

The stream destructor 330 may then compare the two audio frames to identify similarities. For example, the base layer 340 audio frame and the enhancement layer 345A audio frame may share a sequence of bits or bytes. An audio frame may include a data portion and a non-data portion (e.g., a header), and the shared sequence may be found in the data portion or the non-data portion of the audio frames. If this is the case, the sequence in the enhancement layer 345A audio frame may be substituted with a command. The command may be a reference to the base layer 340 audio frame and indicate a location in the base layer 340 audio frame in which the common sequence is found. The command may be executed by the client device 110 when reconstructing an audio stream. For example, the commands in an audio frame may be compiled into a table that is separate from the audio frames that are referenced by the commands. When executed, a command may be substituted with the data found at the location that is referenced. Example commands are described in greater detail below with respect to FIG. 4. The base layer 340 audio frame and the enhancement layer 345A audio frame may share multiple contiguous and non-contiguous sequences, and each common sequence in the enhancement layer 345A audio frame may be substituted with an appropriate command.

Likewise, the stream destructor 330 may compare a third audio frame corresponding to the enhancement layer 345B with the base layer 340 audio frame and the enhancement layer 345A audio frame. Sequences in the enhancement layer 345B audio frame that correlate with (or otherwise match) sequences in the base layer 340 audio frame may be substituted with commands that reference the base layer 340 audio frame as described above. Sequences in the enhancement layer 345B audio frame that correlate with sequences in the enhancement layer 345A audio frame may be substituted with commands that reference the enhancement layer 345A audio frame. The process described herein may be completed for audio frames in each additional enhancement layer if more than two enhancement layers are generated.

The base layer 340, the enhancement layer 345A, and the enhancement layer 345B may be packaged (e.g., multiplexed) such that each layer corresponds to a track file 350. The track files 350 may be provided to a client application 360, for example, over a network. Storing packaged versions of the layers in separate files can facilitate the content server 120 (see FIG. 1) being able to merely store and serve files rather than having to include intelligence for assembling layers prior to streaming. However, in another embodiment, the content server 120 performs this assembly prior to streaming. Alternatively, the base layer 340, the enhancement layer 345A, and the enhancement layer 345B may be packaged such that the layers correspond to a single track file 350.

The client application 360 may include a layer constructor, such as the layer constructor 112 of FIG. 1, which generates an audio stream based on the various track files 350. The client application 360 may follow a sequence of commands in a block in the execution layer to render an audio frame of the audio stream. The rendered audio frames may be sent to a decoder 370 so that the audio frame can be decoded. Once decoded, the decoded signal can be reconstructed and reproduced. The client application 360 and/or the decoder 370 may represent the functionality provided by the client device 110 of FIG. 1.

Example Audio Layer Hierarchy and Bitrates

As described above, the base layer and the enhancement layers may have a hierarchy established at creation time. Thus, a first enhancement layer can be a child layer of the base layer, a second enhancement layer can be a child layer of the first enhancement layer, and so on.

As described above, the enhancement layers may add resolution detail, channels, higher audio sampling frequencies, and/or the like to improve the base layer. For example, Table 1 below illustrates example layer bitrates (in Kbps) for various channel counts:

TABLE 1

| Channel Count | Base Layer Bitrate | Enhancement Layer #1 Bitrate | Enhancement Layer #2 Bitrate | Enhancement Layer #3 Bitrate |
|---|---|---|---|---|
| 2.x | 128 | 160 | | |
| 2.x | 160 | 255 | | |
| 2.x | 128 | 160 | 255 | |
| 5.x | 192 | 384 | | |
| 5.x | 192 | 255 | 510 | |
| 5.x | 192 | 255 | 384 | 510 |
| 7.x | 447 | 768 | | |
| 7.x | 447 | 639 | | |
| 7.x | 447 | 510 | 639 | 768 | where x can be 0 or 1 to represent the absence or presence of a subwoofer or low frequency effects (LFE) channel. Each row in Table 1 illustrates an independent example of layered audio that includes bitrates for a base layer and one or more enhancement layers.

In an embodiment, the highest level enhancement layer the client device receives for which that layer and all lower layers pass a hash check can function as an execution layer, which can be rendered by the client device. If the hash check fails for that layer, the hash check is tested for the next highest enhancement layer, which can be the execution layer if the check passes for that layer and all lower layers, and so on. Hash checks are described in greater detail below. The execution layer can use data from parent layers.

Example Enhancement Layer Audio Block

FIG. 4 illustrates an example enhancement layer audio block 400. In an embodiment, the enhancement layer audio block 400 is generated by the audio layer creation system 130 of FIG. 1. As illustrated in FIG. 4, the enhancement layer audio block 400 includes a header 410, block-specific commands 420A-N, and a data field 450. The data field 450 may include a single audio frame or a plurality of the audio frames described above. The header 410 may include a syncword 411, a CRC 412, a reserved field 414, and a count 416. The syncword 411 may be a synchronized word that is coded to the layer hierarchy, identifying an enhancement layer audio block and which enhancement layer the audio block is a part of. For example, the syncword 411 may identify the enhancement layer (e.g., the first enhancement layer, the second enhancement layer, etc.).

In an embodiment, the CRC 412 is one example of a hashed value, which may be created using a hash or checksum function. The CRC 412 may be calculated based on data in the enhancement layer audio block 400 and data in an audio block in the parent layer (e.g., an audio block in the parent layer that corresponds to the same timeframe as the enhancement layer audio block 400). In an embodiment, the CRC 412 is based on bytes in the enhancement layer audio block 400 and bytes in the parent audio block.

The CRC 412 may be used to verify the integrity of the enhancement layer audio block 400 and/or to verify that the enhancement layer audio block 400 is indeed an audio block in the immediate child layer to the parent layer. In an embodiment, the client device 110 uses the CRC 412 to perform such verification. For example, upon receiving the layered audio data, the client device 110 may extract the hash from an audio block in the execution layer. The client device 110 may then generate a test hash based on data in the audio block and an audio block in a parent layer to the execution layer. If the extracted hash and the test hash match, then the audio block is verified and playback will occur. If the extracted hash and the test hash do not match, then the audio block is not verified and playback of the audio block will not occur. In such a case, the client device 110 may move to the parent layer and set the parent layer to be the execution layer. The same hash verification process may be repeated in the new execution layer. The client device 110 may continue to update the execution layer until the hash can be verified.

However, while the execution layer may change for one audio block, the execution layer may be reset for each new audio block. While the hash for a first audio frame in the first execution layer may not have been verified, the hash for a second audio frame in the first execution layer may be verified. Thus, the client device 110 may initially play a high performance track, then begin to play a lower performance track (e.g., a basic audio track), and then once again play a high performance track. The client device 110 may seamlessly switch from the high performance track to the lower performance track and back to the high performance track. Thus, the client device 110 may provide continuous, uninterrupted playback of content (albeit at a variable performance level).

In an embodiment, the reserved field 414 includes bits that are reserved for future use. The count 416 may indicate a number of commands that follow the header 410.

The commands 420A-N may be a series of memory copy operations (e.g., using the "memcpy" function in an example C programming language implementation). The memory copy operations, when executed by the client device 110, can reconstruct a valid audio frame based on the data 450. The commands 420A-N may be organized such that the reconstruction of the audio frame occurs in sequence from the first byte to the last byte. As described above, the commands 420A-N may also be references or pointers. The commands 420A-N may refer to data found in audio blocks in one or more parent layers and/or the current layer.

As an example, the command 420A may include a reserved field 421, a source field 422, a size field 424, and a source offset field 426. The commands 420B-N may also include similar fields. The reserved field 421 may be a one-bit field reserved for later use. The source field 422 may be an index that indicates the layer from which the data is to be copied from. For example, the source field 422 may indicate that data is to be copied from a parent layer, a grandparent layer, the base layer, or the like. The value in the source field 422 may correspond to the relative position of the layer in the layer hierarchy (e.g., base layer may be 0, first enhancement layer may be 1, etc.). Thus, when the command 420A is executed by the client device 110, the command may indicate the location of data that is to be copied into the reconstructed audio frame.

The size field 424 may indicate a number of bytes that is to be copied from the audio block in the layer indicated in the source field 422. The source offset field 426 may be an offset pointer that points to the first byte in the audio block from which data can be copied.

In an embodiment, the data field 450 includes bytes in a contiguous block. The data in the data field 450 may be the data that is the difference between an audio track based on an audio frame in the parent layer and an audio track that is a higher performance version of the audio track based on an audio frame in the parent layer (e.g., the data in the data field 450 is the data that incrementally enhances the data in the parent layer audio block).

In some embodiments, the initial data in a current audio block and the data in a parent layer audio block are the same. The current audio block may later include additional data not found in the parent layer audio block. Thus, the initial data in the current audio block can be substituted with one or more references to the parent layer audio frame. Accordingly, as illustrated, the commands 420A-N can follow the header 410 and come before the data field 450. However, in other embodiments, the initial data in a current audio block and the data in a parent layer audio block are not the same. Thus, not shown, the commands 420A-N may not be contiguous. Rather, the commands 420A-N may follow the header 410, but be interspersed between blocks of data.

Example Audio Block Metadata Structure

Figure 5:
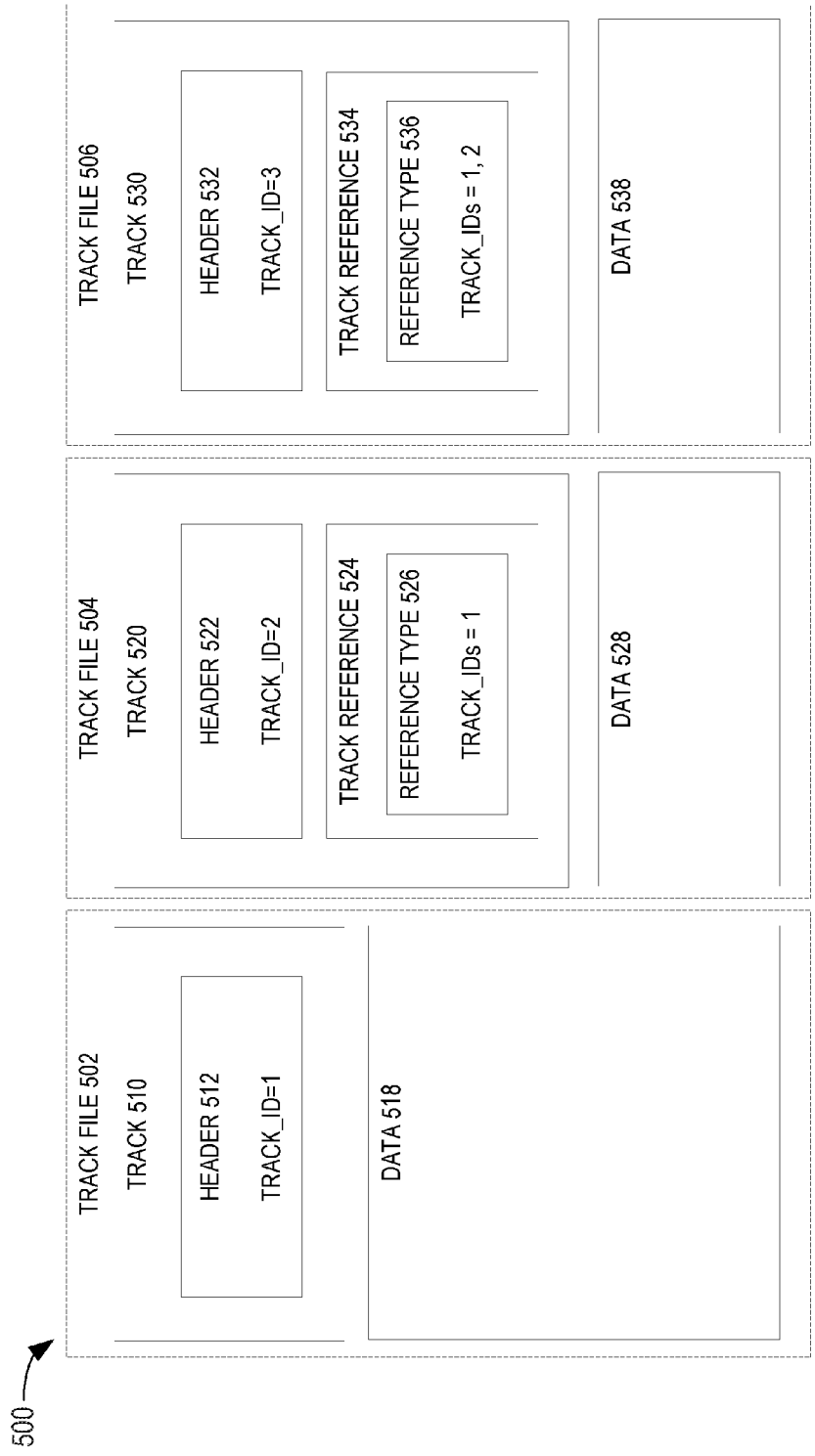
FIG. 5 illustrates an example metadata structure of layered audio blocks.

FIG. 5 illustrates an example metadata structure 500 of layered audio track file 502, 504, and 506. The track file 502 represents an example track file, such as defined by ISO/IEC 14496 part 12, comprising a base layer, the track file 504 represents an example track file comprising a first enhancement layer, and the track file 506 represents an example track file comprising a second enhancement layer.

In an embodiment, the track file 502 includes a track 510 and data 518. The track 510 includes a header 512 that identifies the track (e.g., the layer). The track file 504 also includes a track 520 that includes a header 522 that identifies the track of the track file 504. The track 520 also includes a track reference 524, which includes a reference type 526. The reference type 526 may include a list of tracks on which the track 520 depends (e.g., the base layer in this case). The data 528 may include the audio blocks for the layer that corresponds with the track file 502. Similarly, the track file 506 includes data 538 and a track 530 that includes a header 532 that identifies the track of the track file 506. The track 530 includes a track reference 534, which includes a reference type 536. The reference type 536 may include a list of tracks on which the track 530 depends (e.g., the base layer and the first enhancement layer in this case).

Example Audio Layer Coding Process

Figure 6A:
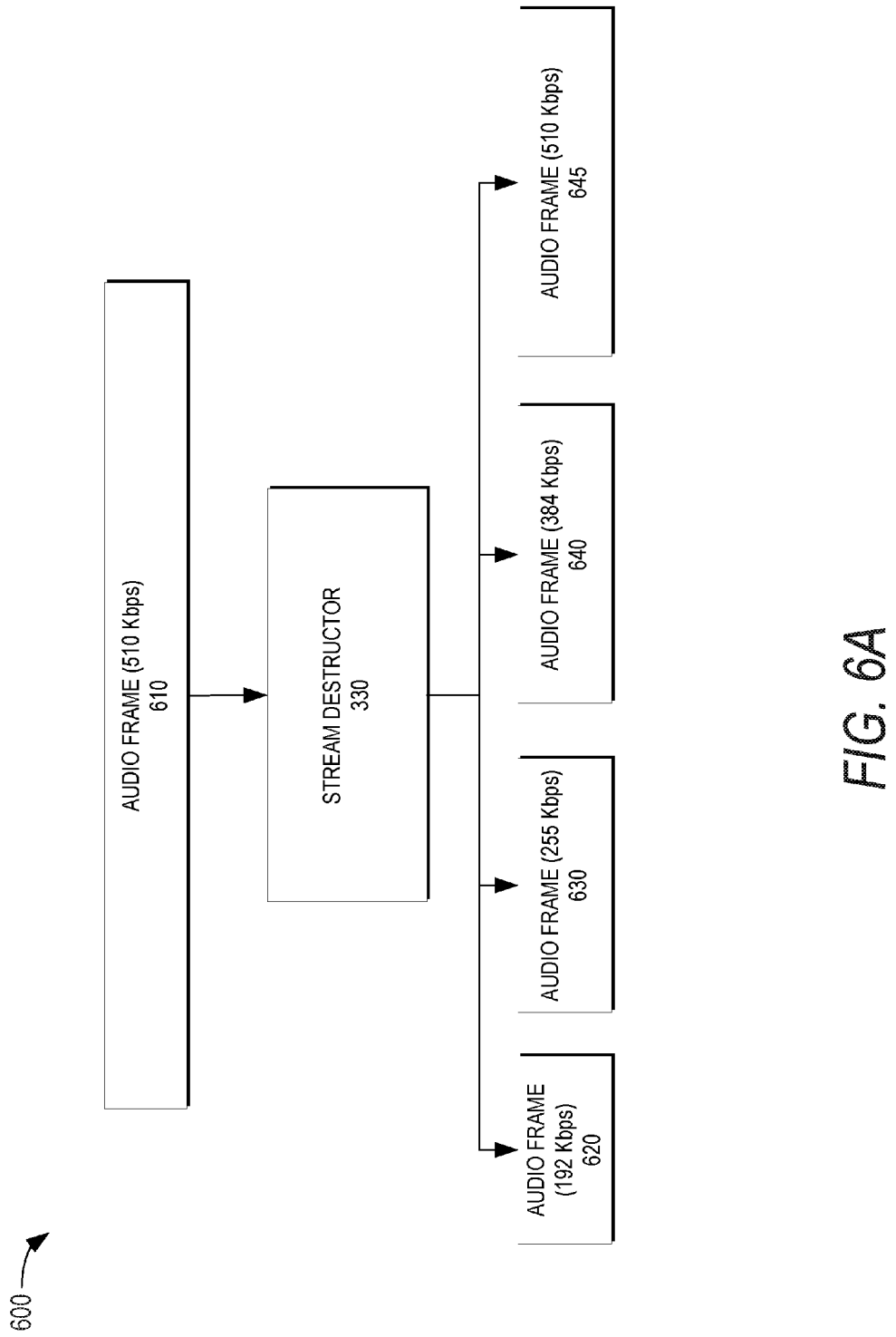
FIGS. 6A-E illustrate an embodiment of an audio layer coding process.
Figure 6B:
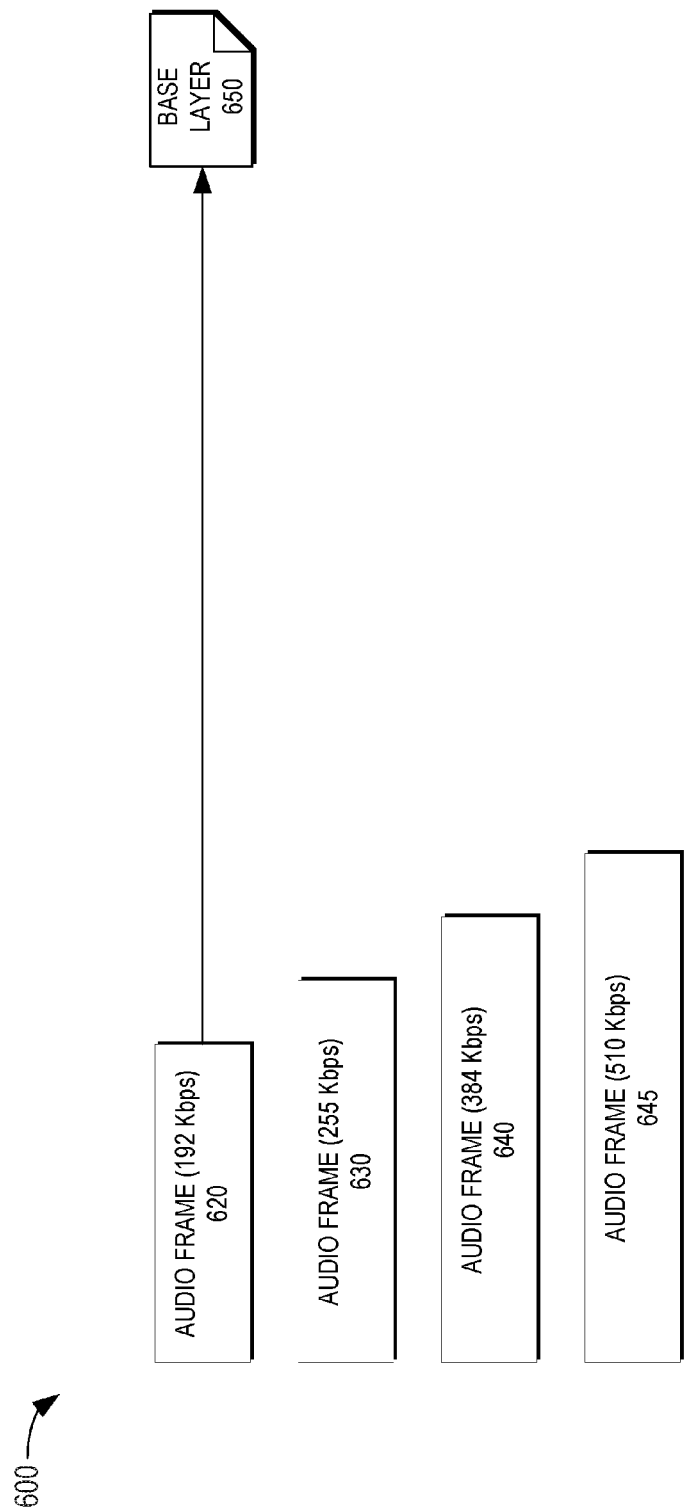
Figure 6C:
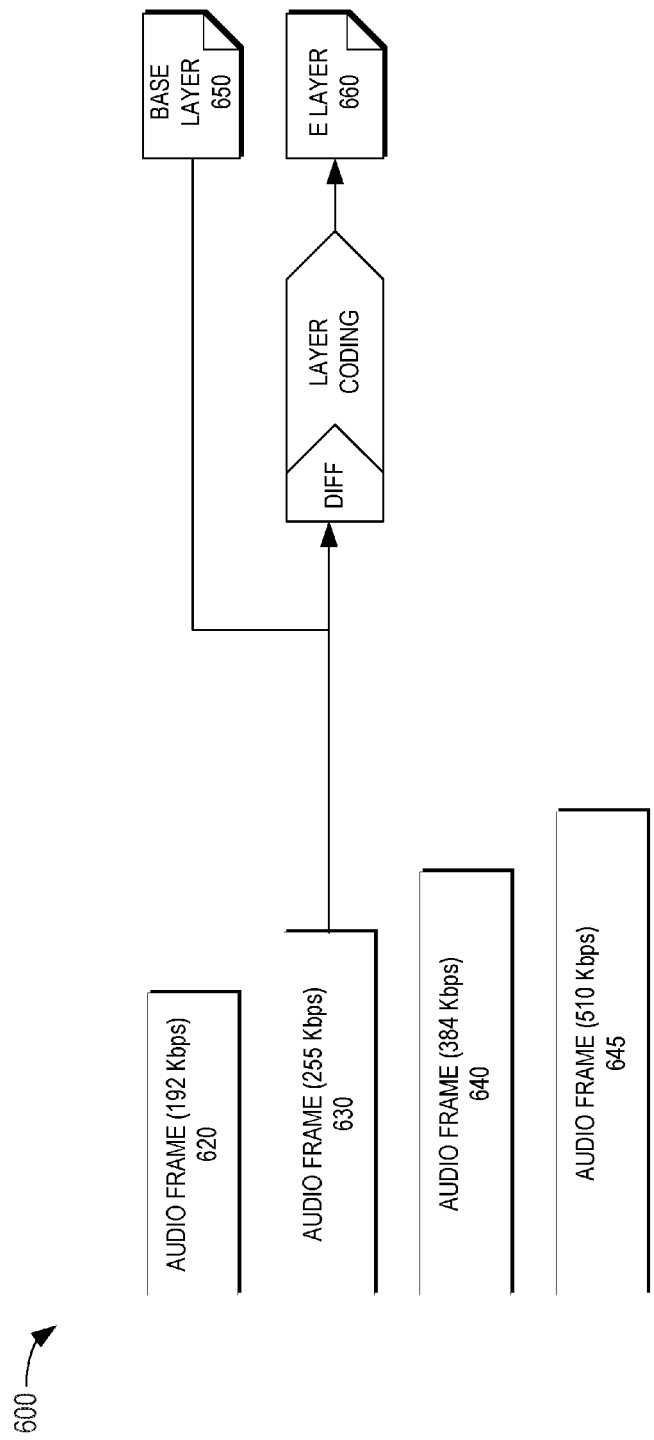
Figure 6D:
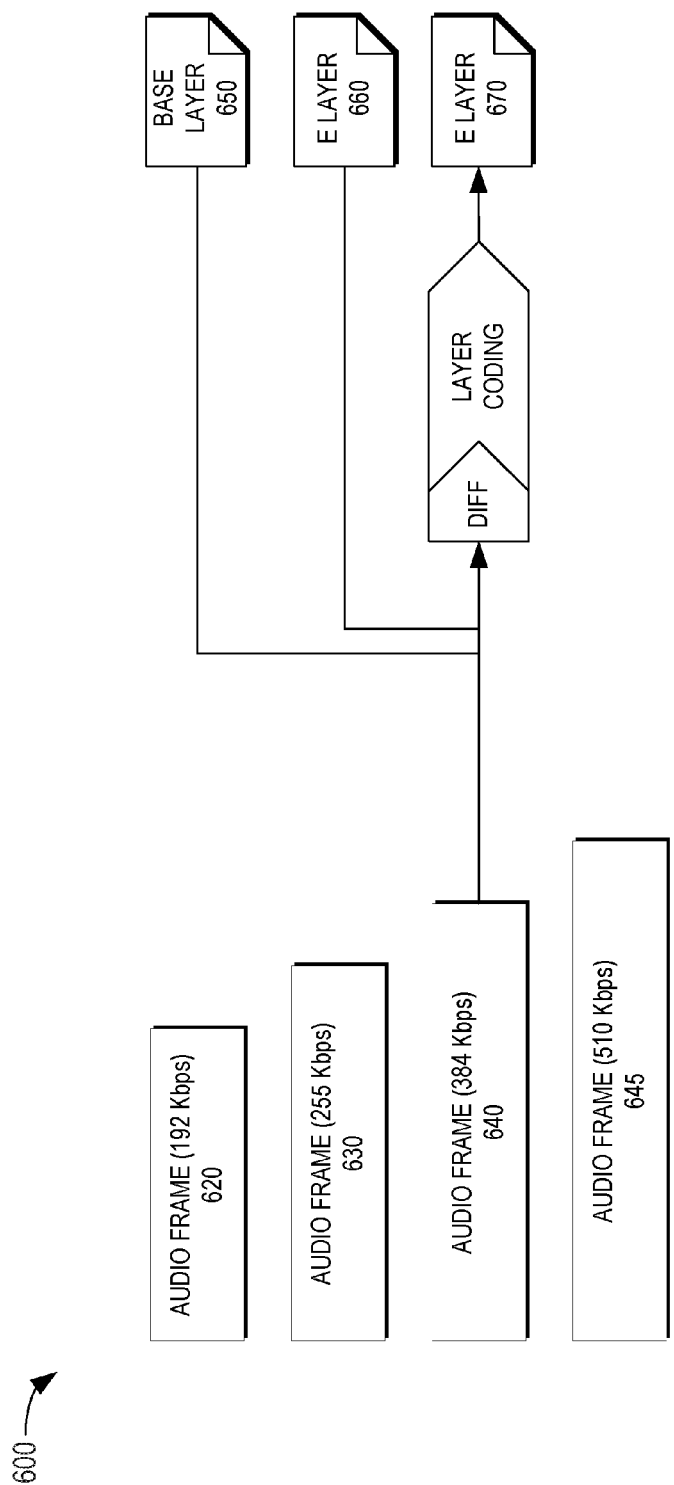
Figure 6E:
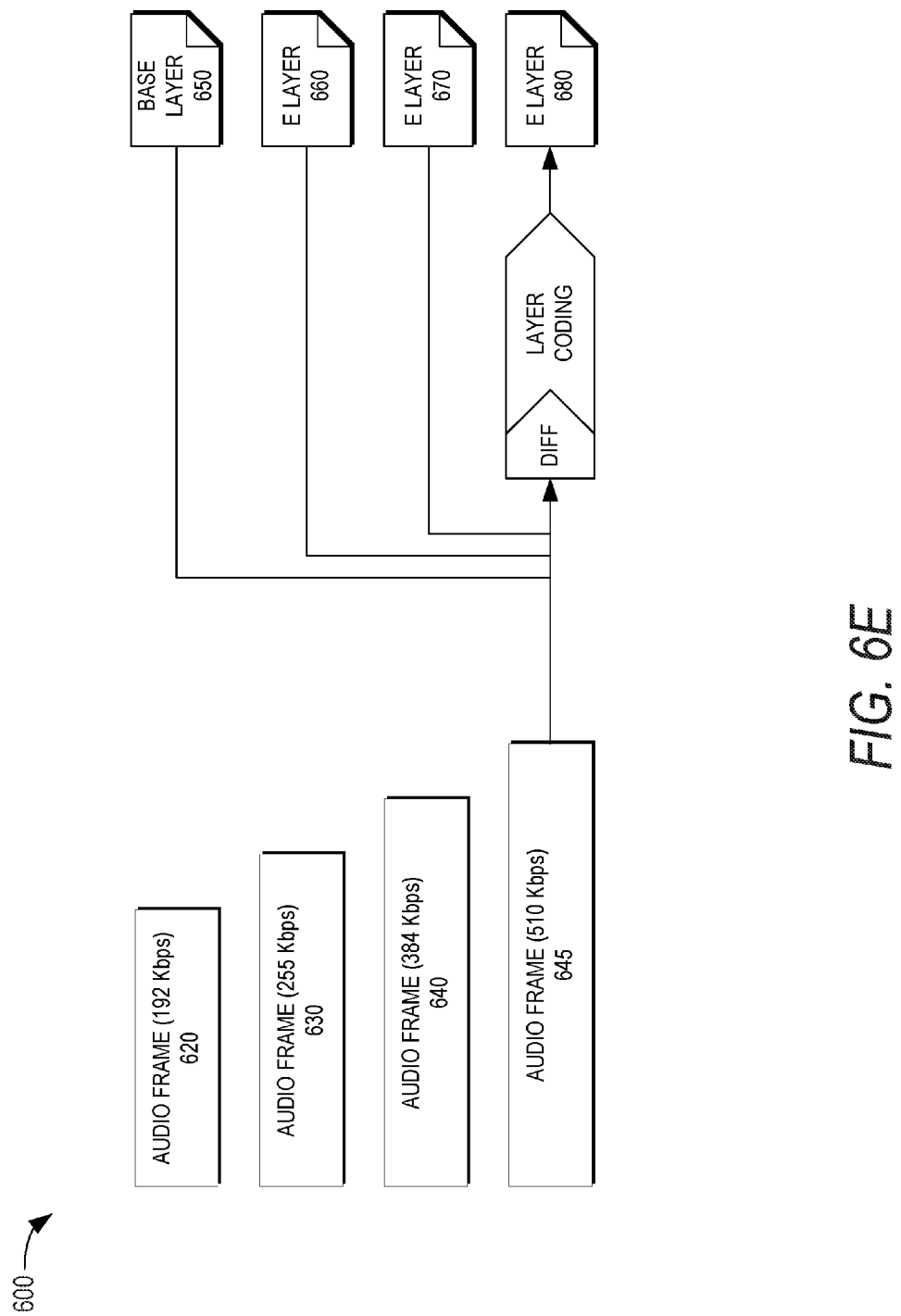

FIGS. 6A-E illustrate an audio layer coding process 600. The coding process 600 may be implemented by any of the systems described herein. As illustrated in FIG. 6A, an audio frame 610 may have a bitrate of 510 Kbps. The audio frame 610 may be part of an audio file stored in the audio data repository 150 (e.g., one of the audio source files 310). The audio frame 610 may pass through the stream destructor 330, which can generate four different audio frames in this example, one each for a different audio layer. For example, the stream destructor 330 may generate an audio frame 620 that has a bitrate of 192 Kbps and is associated with a base layer 650, as illustrated in FIG. 6B. The stream destructor 330 may generate an audio frame 630 that, when combined with the data from the audio frame 620, has a bitrate of 255 Kbps and is associated with a first enhancement layer 660, as illustrated in FIG. 6C. The stream destructor 330 may also generate an audio frame 640 that, when combined with the data from the audio frame 620 and the audio frame 630, has a bitrate of 384 Kbps and is associated with a second enhancement layer 670, as illustrated in FIG. 6D. The stream destructor 330 may also generate an audio frame 645 that, when combined with the data from the audio frames 620, 630, and 640, has a bitrate of 510 Kbps and is associated with a third enhancement layer 680, as illustrated in FIG. 6E. While FIG. 6A illustrates a single audio frame 610, this is not meant to be limiting. Multiple input audio frames may be provided to the stream destructor 330. In addition, while FIGS. 6A-E illustrate the audio frame 610 being separated into three different audio frames 620, 630, and 640, this is not meant to be limiting. The stream destructor 330 may generate any number of audio frames and any number of audio layers.

As illustrated conceptually in FIG. 6C, the audio frame for the first enhancement layer 660 may be produced by taking a data difference between the base layer 650 audio frame and the audio frame 630. Any data similarities may be substituted with a command that refers to the base layer 650 audio frame. The data difference and commands may be coded to produce the first enhancement layer 660 audio frame.

As illustrated conceptually in FIG. 6D, the audio frame for the second enhancement layer 670 may be produced by taking a data difference between the base layer 650 audio frame, the first enhancement layer 660 audio frame, and the audio frame 640. Any data similarities may be substituted with a command that refers to the base layer 650 audio frame and/or the first enhancement layer 660 audio frame. The data difference and commands may be coded to produce the second enhancement layer 670 audio frame.

As illustrated conceptually in FIG. 6E, the audio frame for the third enhancement layer 680 may be produced by taking a data difference between the base layer 650 audio frame, the first enhancement layer 660 audio frame, the second enhancement layer 670 audio frame, and the audio frame 645. Any data similarities may be substituted with a command that refers to the base layer 650 audio frame, the first enhancement layer 660 audio frame, and/or the second enhancement layer 670 audio frame. The data difference and commands may be coded to produce the third enhancement layer 680 audio frame.

Substitution of Data with Commands Examples

FIGS. 7A-C illustrate example scenarios where common data is substituted with commands in a frame. As illustrated in FIG. 7A, a base layer 710 includes three bytes 711-713, a first enhancement layer 720 includes five bytes 721-725, and a second enhancement layer 730 includes seven bytes 731-737. The number of bytes shown is merely for explanatory purposes, and the amount of bytes in an actual frame may differ.

The three bytes 711-713 in the base layer 710 are equivalent to the first three bytes 721-723 in the first enhancement layer 720. Thus, the bytes 721-723 in the first enhancement layer 720 may be substituted with a command that references the bytes 711-713, as illustrated in FIG. 7B. Alternatively, not shown, each byte 721, 722, and 723 may be substituted with a command that references the appropriate byte 711, 712, or 713 in the base layer 710.

The three bytes 711-713 in the base layer 710 are equivalent to the first three bytes 731-733 in the second enhancement layer 730. The last two bytes 724-725 in the first enhancement layer 720 are equivalent to bytes 734-735 in the second enhancement layer 730. Thus, the bytes 731-733 in the second enhancement layer 730 may be substituted with a command that references the bytes 711-713 and the bytes 734-735 in the second enhancement layer 730 may be substituted with a command that references the bytes 724-725, as illustrated in FIG. 7C. Alternatively, not shown, each byte 731, 732, and 733 may be substituted with a command that references the appropriate byte 711, 712, or 713 in the base layer 710 and each byte 734 and 735 may be substituted with a command that references the appropriate byte 724 or 725 in the first enhancement layer 720.

As described herein, the audio frame comparator 132 can compare the bits or bytes in audio frames. To achieve the benefits of data compression, the audio frame comparator 132 may substitute common data with commands in the child layer regardless of where the data is located in the child layer or the parent layers (e.g., the audio frame comparator 132 may find that data in the data portion of a child layer audio frame is the same as the data in the header portion of a parent layer audio frame). For example, bytes 736-737 in the second enhancement layer 730 can represent the difference in data between the first enhancement layer 720 and the second enhancement layer 730. Generally, the bytes 736-737 may not be found in the parent layers. However, the byte 737 happens to be the same as the byte 712 in the base layer 710. Thus, the audio frame comparator 132 may substitute the data in the byte 737 with a command that references the byte 712.

In some embodiments, the commands are not the same size as the data that is substituted. Thus, the byte 721, for example, may not be the length of a byte after the command is inserted to substitute the data. FIGS. 7A-C are simplistic diagrams to illustrate the process. In general, hundreds or thousands of contiguous bytes may be common between a child layer audio frame and a parent layer audio frame. The commands, however, may be a few bytes (e.g., four bytes), as illustrated in FIG. 4. Thus, the insertion of commands, regardless of which data is common, may achieve a significant reduction in the amount of data streamed to the client device 110 or stored on a computer-readable storage medium. Thus, the systems and processes described herein can provide some compression of the audio data by virtue of creating layers.

Example Audio Layer Reconstruction Process

Figure 8A:
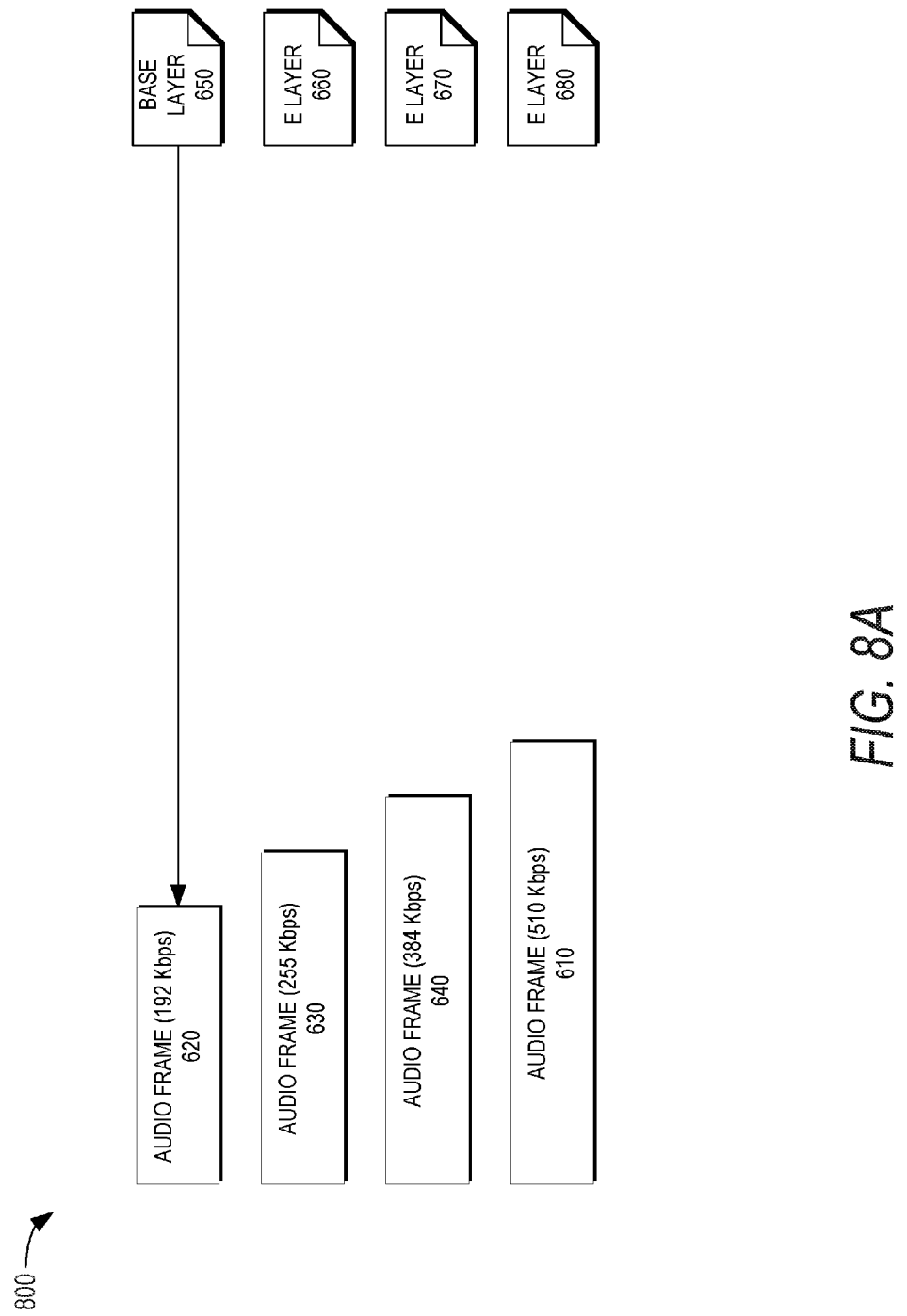
FIGS. 8A-B illustrate an embodiment of an audio layer deconstructing process.
Figure 8B:
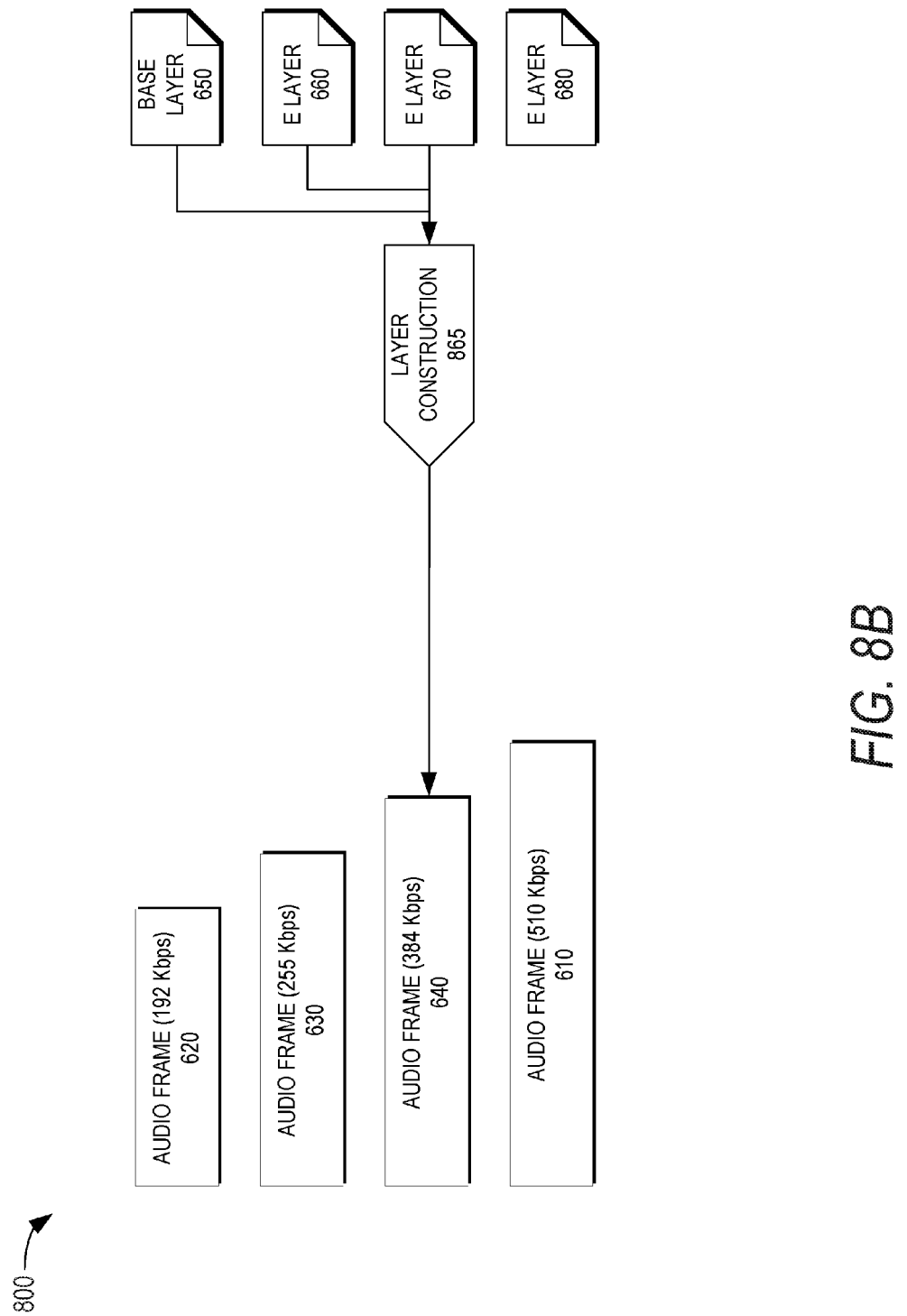

FIGS. 8A-B illustrate an example audio layer reconstructing process 800. The process 800 can be implemented by any of the systems described herein. As illustrated in FIG. 8A, the base layer 650 audio frame may be reconstructed without reference to any other audio layer (and need not be reconstructed in an embodiment). The example base layer 650 audio frame may correspond with the audio frame 620, which has a bitrate of 192 Kbps.

As illustrated in FIG. 8B, the audio frame 640, which has a bitrate of 384 Kbps, can be constructed based on the base layer 650 audio frame, the first enhancement layer 660 audio frame, and the second enhancement layer 670 audio frame. As described above, the second enhancement layer 670 may be the execution layer so long as the hash check passes for the second enhancement layer 670, the first enhancement layer 660, and the base layer 650 in the client device. The second enhancement layer 670 audio frame may include commands that refer to data in the second enhancement layer 670 audio frame, the first enhancement layer 660 audio frame, and the base layer 650 audio frame. Execution of the commands may produce the audio frame 640. A similar process can be continued hierarchically for any of the other enhancement layers (or any not shown) to produce any desired output frame or stream.

Additional Embodiments

In other embodiments, a base layer is not a normal and fully playable audio track. For example, two versions of an audio track may be available: a 5.1 channel audio track and a 7.1 channel audio track. Each audio track may share some data (e.g., audio associated with the front channels, audio associated with the subwoofer, etc.); however, such data alone may not be a fully playable audio track. Nonetheless, to achieve the efficiencies described herein, such shared data may be included in a base layer. A first enhancement layer may include the remaining data that, when combined with the data in the base layer, includes a fully playable 5.1 channel audio track. A first alternate enhancement layer may include the remaining data that, when combined with the data in the base layer, includes a fully playable 7.1 channel audio track. Having a first enhancement layer and a first alternate enhancement layer, rather than just one enhancement layer that includes the 7.1 channel information, may be more efficient in cases in which only 5.1 channel information is desired. With just one enhancement layer, the client device 110 may retrieve excess data that is to be discarded when reconstructing the audio layers (e.g., the sixth and seventh channel data). However, with the two enhancement layers, the client device 110 can retrieve just the data that is desired.

As described above, the layered audio data can be stored in a non-transitory computer-readable storage medium, such as an optical disc (e.g., DVD or Blu-ray), hard-drive, USB key, or the like. Furthermore, one or more audio layers can be encrypted. In some embodiments, the encrypted audio layers can be encrypted using a hash function.

Additional Example Processes

Figure 9:
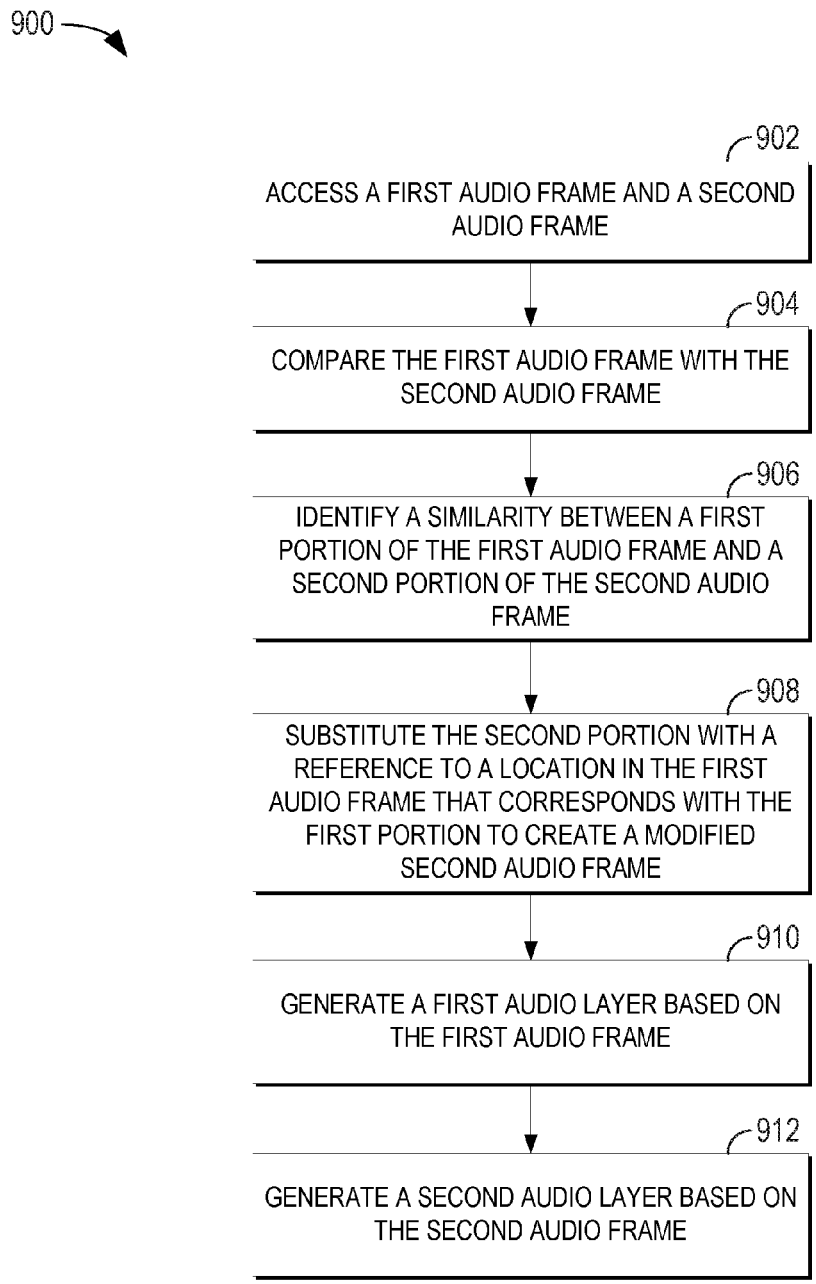
FIG. 9 illustrates an embodiment of a process for generating layered audio.

FIG. 9 illustrates an example process 900 for generating layered audio. In an embodiment, the process 900 can be performed by any of the systems described herein, including the audio layer creation system 130 discussed above with respect to FIG. 1. Depending on the embodiment, the process 900 may include fewer and/or additional blocks or the blocks may be performed in an order different than illustrated.

In block 902, a first audio frame and a second audio frame are accessed. In an embodiment, the audio frames are accessed from the audio data repository 150. The first audio frame may correspond with a base layer audio frame and the second audio frame may correspond with an enhancement layer audio frame. The first audio frame and the second audio frame may correspond to the same period of time.

In block 904, the first audio frame and the second audio frame are compared. In an embodiment, the bytes of the first audio frame and the second audio frame are compared.

In block 906, a similarity between a first portion of the first audio frame and a second portion of the second audio frame is identified. In an embodiment, the first portion and the second portion comprise the same sequence of bits or bytes. In some embodiments, the first portion and the second portion are each located in a corresponding location in the respective audio frame (e.g., the beginning of the data portion of the audio frame). In other embodiments, the first portion and the second portion are located in different locations in the respective audio frame (e.g., the first portion is in the beginning of the data portion and the second portion is at the end of the data portion, the first portion is in the header and the second portion is in the data portion, etc.).

In block 908, the second portion is substituted with a reference to a location in the first audio frame that corresponds with the first portion to create a modified second audio frame. In an embodiment, the reference is comprised within a command that can be executed by a client device, such as the client device 110, to reconstruct an audio stream from layered audio data.

In block 910, a first audio layer is generated based on the first audio frame. In an embodiment, the first audio layer comprises a plurality of audio frames.

In block 912, a second audio layer is generated based on the second audio frame. In an embodiment, the second audio layer comprises a plurality of audio frames.

In some embodiments, the first audio layer and the second audio layer are made available for transmission to a client device over a network. The transmission of the first audio layer over the network may require a first amount of bandwidth and transmission of both the first audio layer and the second audio layer over the network may require a second amount of bandwidth that is greater than the first amount of bandwidth. The client device may be enabled to receive and output the first audio layer and the second audio layer together if the second amount of bandwidth is available to the client device. The client device may also be enabled to receive and output the first audio layer if only the first amount of bandwidth is available to the client device.

In other embodiments, the first audio layer and the second audio layer are stored in computer-readable storage medium (e.g., optical discs, flash drives, hard drives, etc.). The audio layers may be transferred to a client device via the computer-readable storage medium.

Figure 10:
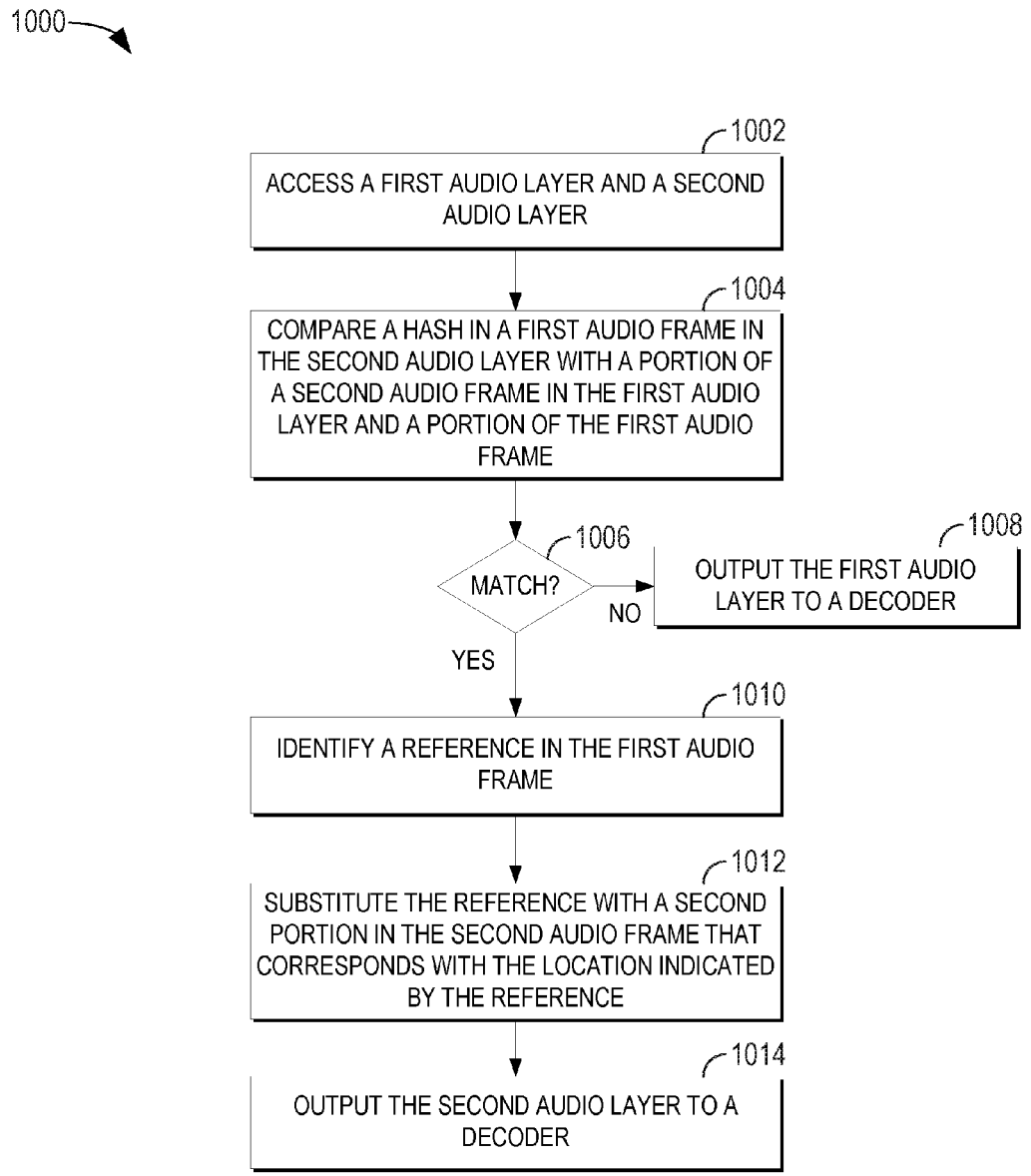
FIG. 10 illustrates an embodiment of a process for reconstructing an audio stream.

FIG. 10 illustrates an example process 1000 for reconstructing an audio stream. In an embodiment, the process 1000 can be performed by any of the systems described herein, including the client device 110 discussed above with respect to FIG. 1. Depending on the embodiment, the process 1000 may include fewer and/or additional blocks and the blocks may be performed in an order different than illustrated. For example, the process 1000 may not include blocks 1004, 1006, and/or 1008, which relate to a hash check as described below.

In block 1002, a first audio layer and a second audio layer are accessed. In an embodiment, the first audio layer and the second audio layer are streamed or downloaded from a content server, such as the content server 120, over a network. In another embodiment, the first audio layer and the second audio layer are accessed from a computer-readable storage medium that stores the first audio layer and the second audio layer.

In block 1004, a hash in a first audio frame in the second audio layer is compared with a portion of a second audio frame in the first audio layer and a portion of the first audio frame. In an embodiment, the portion of the second audio frame comprises bytes in the second audio frame. In a further embodiment, the portion of the first audio frame comprises bytes in the first audio frame.

In block 1006, the process 1000 determines whether there is a match between the hash and the portions of the first audio frame and the second audio frame based on the comparison. If there is a match, the process 1000 proceeds to block 1010. If there is not a match, the process 1000 proceeds to block 1008.

In block 1008, the first audio layer is output to a decoder. In an embodiment, if there is no match, then the audio frame in the second audio layer cannot be verified. Thus, a lower quality audio frame is output to a decoder instead.

In block 1010, a reference in the first audio frame is identified. In an embodiment, the reference is comprised within a command. The command may reference a location in a parent layer audio frame.

In block 1012, the reference is substituted with a second portion in the second audio frame that corresponds with the location indicated by the reference. In an embodiment, the location indicated by the reference includes an identification of the parent layer, a number of bytes to copy, and an offset within the audio frame to start copying from. In a further embodiment, blocks 1010 and 1012 are repeated for each identified reference. The data in the referenced location may be stored in a buffer or sent directly to a decoder. For data in the first audio frame that is not a reference, such data is also stored in the buffer or sent directly to the decoder. The data may be buffered or sent directly to the decoder in the order that it appears in the first audio frame. The buffered data (or the data in the decoder) may represent an audio stream to be output to a speaker.

In block 1014, the second audio layer is output to the decoder. In an embodiment, the second audio layer comprises audio frames in which the references have been substituted with data from the locations that were referenced. The decoder may output the resulting data to a speaker, a component that performs audio analysis, a component that performs watermark detection, another computing device, and/or the like.

Figure 11:
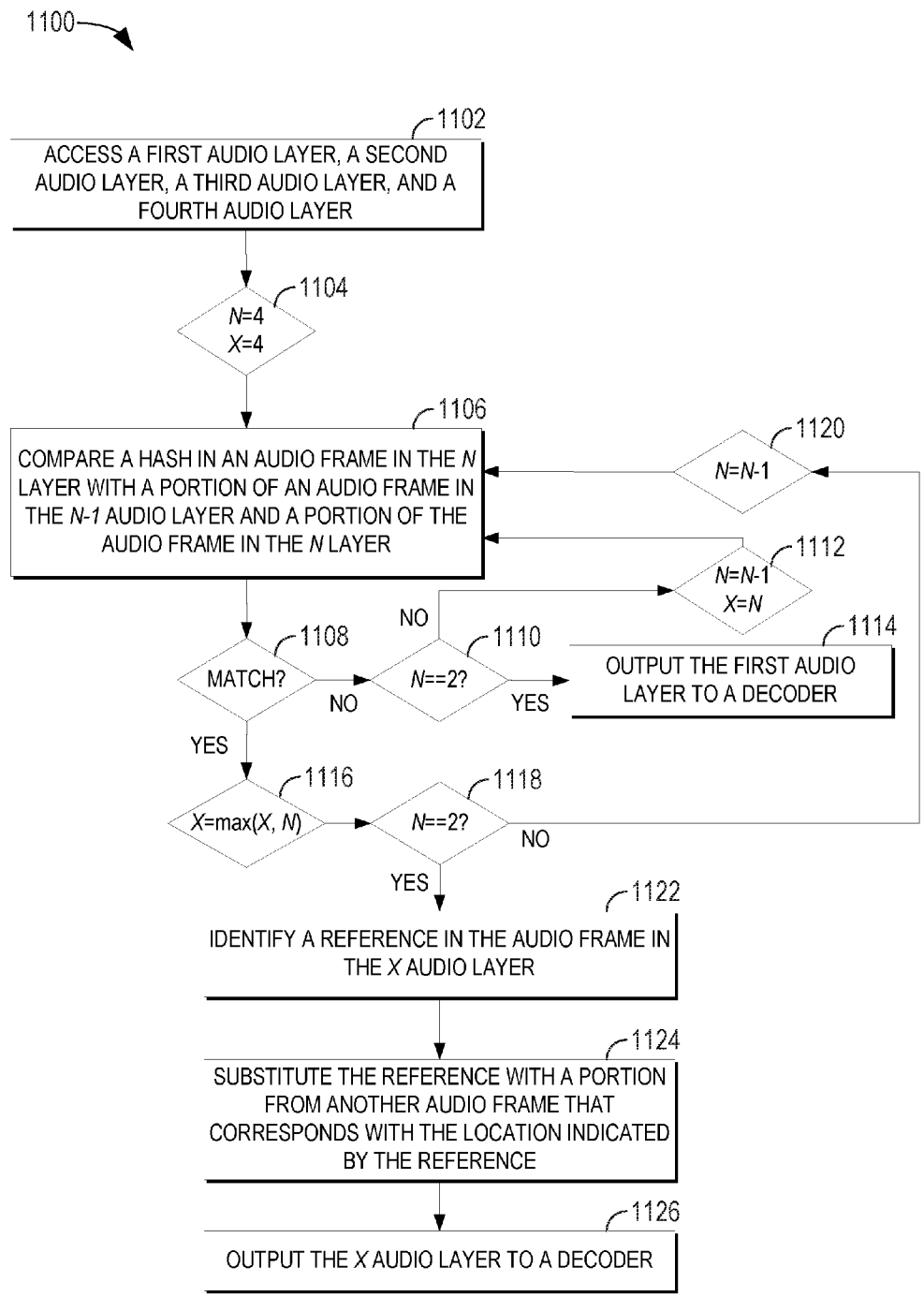
FIG. 11 illustrates another embodiment of a process for reconstructing an audio stream.

FIG. 11 illustrates another example process 1100 for reconstructing an audio stream. In an embodiment, the process 1100 can be performed by any of the systems described herein, including the client device 110 discussed above with respect to FIG. 1. The process 1100 illustrates how a client device may determine which layer audio frame to decode such that the client device can provide continuous, uninterrupted playback of content even if the data in one or more enhancement layer audio frames is corrupted. Depending on the embodiment, the process 1100 may include fewer and/or additional blocks and the blocks may be performed in an order different than illustrated. In general, in certain embodiments, the client device may output a lower-level layer instead of a higher-level layer if the higher-level layer is corrupted, missing data, or otherwise fails a hash or checksum.

In block 1102, a first audio layer, a second audio layer, a third audio layer, and a fourth audio layer are accessed. In an embodiment, the audio layers are streamed or downloaded from a content server, such as the content server 120, over a network. In another embodiment, the audio layers are accessed from a computer-readable storage medium that stores the audio layers. While the process 1100 is described with respect to four audio layers, this is not meant to be limiting. The process 1100 can be performed with any number of audio layers. The process 1100 then proceeds to block 1104.

In block 1104, variables N and X are set. For example, variable N is set to 4 and variable X is set to 4. Variable N may represent the current audio layer that is being processed and variable X may represent an audio layer from which an audio frame can be output to a decoder. The process 1100 then proceeds to block 1106.

In block 1106, a hash in an audio frame in the N layer is compared with a portion of an audio frame in the N−1 audio layer and a portion of the audio frame in the N layer. In an embodiment, the portion of the N−1 audio layer audio frame comprises bytes in the N−1 audio layer audio frame. In a further embodiment, the portion of the N audio layer audio frame comprises bytes in the N audio layer audio frame. The process 1100 then proceeds to block 1108.

In block 1108, the process 1100 determines whether there is a match between the hash and the portions of the N−1 audio layer audio frame and the N audio layer audio frame based on the comparison. If there is a match, the process 1100 proceeds to block 1116. If there is not a match, the process 1100 proceeds to block 1110.

If the process proceeds to block 1110, then an error in an audio frame has occurred. Any audio frame that corresponds to an enhancement layer that is N or higher will not be decoded. In block 1110, the process 1100 determines whether the variable N is equal to 2. If the variable N is equal to 2, no further layers need to be processed and the process 1100 proceeds to block 1114. If the variable N is not equal to 2, the process 1100 proceeds to block 1112.

In block 1112, variables N and X are set again. For example, variable N is set to be equal to N−1 and variable X is set to be equal to N. The process 1100 then proceeds back to block 1106.

In block 1114, the first audio layer is output to a decoder. In an embodiment, if there is no match between the first audio layer and the second audio layer (e.g., which is checked when the variable N is 2), then the audio frame in the second audio layer cannot be verified. Thus, a lowest quality audio frame (corresponding to the first audio layer) is output to a decoder instead.

If the process proceeds to block 1116, then no error in the audio frame in the N audio layer has occurred. In block 1116, variable X is set. For example, variable X is set to be equal to the maximum of variable N and variable X. The process 1100 then proceeds to block 1118.

In block 1118, the process 1100 determines whether the variable N is equal to 2. If the variable N is equal to 2, no further layers need to be processed and the process 1100 proceeds to block 1122. If the variable N is not equal to 2, the process 1100 proceeds to block 1120.

In block 1120, variable N is set again. For example, variable N is set to be equal to N−1. The process 1100 then proceeds back to block 1106.

In block 1122, a reference in the audio frame in the X audio layer is identified. In an embodiment, the reference is comprised within a command. The command may reference a location in a parent layer audio frame. The process 1100 then proceeds to block 1124.

In block 1124, the reference is substituted with a portion from another audio frame that corresponds with the location indicated by the reference. In an embodiment, the location indicated by the reference includes an identification of the parent layer, a number of bytes to copy, and an offset within the audio frame to start copying from. In a further embodiment, blocks 1122 and 1124 are repeated for each identified reference. The data in the referenced location may be stored in a buffer or sent directly to a decoder. The buffered data (or the data in the decoder) may represent an audio stream to be output to a speaker. The process 1100 then proceeds to block 1126.

In block 1126, the X audio layer is output to the decoder. In an embodiment, the X audio layer comprises audio frames in which the references have been substituted with data from the locations that were referenced. The decoder may output the resulting data to a speaker, a component that performs audio analysis, a component that performs watermark detection, another computing device, and/or the like.

Terminology

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a hardware processor comprising digital logic circuitry, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. A computing environment can include any type of computer system, including, but not limited to, a computer system based on a microprocessor, a mainframe computer, a digital signal processor, a portable computing device, a device controller, or a computational engine within an appliance, to name a few.

The steps of a method, process, or algorithm described in connection with the embodiments disclosed herein can be embodied directly in hardware, in a software module stored in one or more memory devices and executed by one or more processors, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

Disjunctive language such as the phrase "at least one of X, Y and Z," unless specifically stated otherwise, is to be understood with the context as used in general to convey that an item, term, etc. may be either X, Y, or Z, or a combination thereof. Thus, such conjunctive language is not generally intended to imply that certain embodiments require at least one of X, at least one of Y and at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

What is claimed is:

1. A method of reconstructing an audio stream, the method comprising:
   accessing a server over a network to retrieve a first audio layer and a second audio layer, wherein the first audio layer comprises a first audio frame and the second audio layer comprises a second audio frame;
   receiving the first audio layer and the second audio layer, wherein the first audio layer comprises a base layer and the second audio layer comprises an enhancement to the base layer;
   extracting a hash value from the second audio frame of the second audio layer;
   comparing the hash value with a representation of a first portion in the first audio frame and a second portion in the second audio frame; and
   outputting the second audio frame to a decoder or loudspeaker in response to a determination that the comparison yields a match, thereby enabling the enhancement to the base layer to be played back in place of the base layer.

2. The method of claim 1, wherein comparing the hash value with a representation of a first portion in the first audio frame and a second portion in the second audio frame further comprises:
   generating a test hash value based on the first portion and the second portion; and
   comparing the hash value with the test hash value.

3. The method of claim 2, wherein outputting the second audio frame further comprises outputting the second audio frame to the decoder or loudspeaker in response to a determination that the hash value matches the test hash value.

4. The method of claim 2, further comprising outputting the first audio frame to the decoder or loudspeaker in response to a determination that the hash value does not match the test hash value.

5. The method of claim 1, wherein the comparison yields a match, and wherein the method further comprises:
   extracting a second hash value from a third audio frame of the second audio layer, wherein the third audio frame follows the second audio frame in the second audio layer;
   comparing the second hash value with a second test hash value generated based on the third audio frame and a fourth audio frame of the first audio layer;
   determining that the second hash value and the second test hash value do not match; and
   outputting the fourth audio frame to the decoder or the loudspeaker in response to the determination that the second hash value and the second test hash value do not match.

6. The method of claim 5, further comprising:
   extracting a third hash value from a fifth audio frame of the second audio layer, wherein the fifth audio frame follows the third audio frame in the second audio layer;

comparing the third hash value with a third test hash value generated based on the fifth audio frame and a sixth audio frame of the first audio layer;

determining that the third hash value and the third test hash value match; and outputting the fifth audio frame to the decoder or the loudspeaker in response to the determination that the third hash value and the third test hash value match.

7. The method of claim 1, wherein the first audio frame corresponds to a first timeframe and the second audio frame corresponds to the first timeframe.

8. The method of claim 1, wherein the hash value comprises a cyclic redundancy check.

9. A system for reconstructing an audio stream, the system comprising:

a layer constructor comprising a hardware processor configured to:
    access a first audio layer and a second audio layer, wherein the first audio layer comprises a first audio frame and the second audio layer comprises a second audio frame;
    extract a first value from the second audio frame of the second audio layer;
    compare the first value with a representation of a first portion in the first audio frame and a second portion in the second audio frame; and
    output the second audio frame in response to a determination that the comparison yields a match.

10. The system of claim 9, wherein the layer constructor is further configured to:
    generate a test value based on the first portion and the second portion; and
    compare the first value with the test value.

11. The system of claim 10, wherein the layer constructor is further configured to output the second audio frame in response to a determination that the first value matches the test value.

12. The system of claim 10, wherein the layer constructor is further configured to output the first audio frame in response to a determination that the first value does not match the test value.

13. The system of claim 9, wherein the first audio frame corresponds to a first timeframe and the second audio frame corresponds to the first timeframe.

14. The system of claim 9, wherein the first value comprises a cyclic redundancy check.

15. The system of claim 9, wherein the layer constructor is further configured to generate a third audio frame based on the first audio frame and data in the second audio frame that does not refer to another audio frame.

16. The system of claim 15, further comprising a decoder configured to decode the second audio frame, wherein the decoder is further configured to output the decoded second audio frame to a speaker.

17. Non-transitory physical computer storage comprising executable program instructions stored thereon that, when executed by a hardware processor, are configured to at least:
    access a first audio layer and a second audio layer, wherein the first audio layer comprises a first audio frame and the second audio layer comprises a second audio frame;
    extract a hash value from the second audio frame of the second audio layer;
    compare the hash value with a representation of a first portion in the first audio frame and a second portion in the second audio frame;
    determine that the comparison yields a match; and
    output the second audio frame.

18. The non-transitory physical computer storage of claim 17, wherein the executable instructions are further configured to at least:
    generate a test hash value based on the first portion and the second portion; and
    compare the hash value with the test hash value.

19. The non-transitory physical computer storage of claim 18, wherein the executable instructions are further configured to at least determine that the hash value matches the test hash value.

20. The non-transitory physical computer storage of claim 17, wherein the first audio frame corresponds to a first timeframe and the second audio frame corresponds to the first timeframe.

* * * * *